United States Patent
Lochtefeld

(10) Patent No.: US 8,878,243 B2
(45) Date of Patent: Nov. 4, 2014

(54) LATTICE-MISMATCHED SEMICONDUCTOR STRUCTURES AND RELATED METHODS FOR DEVICE FABRICATION

(75) Inventor: Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/773,735

(22) Filed: May 4, 2010

(65) Prior Publication Data

US 2010/0213511 A1    Aug. 26, 2010

Related U.S. Application Data

(63) Continuation of application No. 11/728,032, filed on Mar. 23, 2007, now Pat. No. 7,777,250.

(60) Provisional application No. 60/785,567, filed on Mar. 24, 2006.

(51) Int. Cl.
*H01L 21/20* (2006.01)
*H01L 21/8258* (2006.01)
*H01L 29/66* (2006.01)

(52) U.S. Cl.
CPC ......... *H01L 21/2018* (2013.01); *H01L 21/8258* (2013.01); *H01L 29/66795* (2013.01)
USPC ........ 257/190; 257/14; 257/17; 257/E33.023; 438/478

(58) Field of Classification Search
CPC ...................................................... H01L 21/20
USPC ..................... 257/615, 614, 616, 190, 14, 17, 257/E33.023; 438/478
See application file for complete search history.

(56) References Cited

U.S. PATENT DOCUMENTS

| | | |
|---|---|---|
| 4,307,510 A | 12/1981 | Sawyer et al. |
| 4,322,253 A | 3/1982 | Pankove et al. |
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |

(Continued)

FOREIGN PATENT DOCUMENTS

| | | |
|---|---|---|
| CN | 2550906 | 5/2003 |
| DE | 10017137 | 10/2000 |

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Dale E Page
(74) *Attorney, Agent, or Firm* — Slater and Matsil, L.L.P.

(57) ABSTRACT

Lattice-mismatched materials having configurations that trap defects within sidewall-containing structures.

20 Claims, 30 Drawing Sheets

(56) References Cited

U.S. PATENT DOCUMENTS

| | | | |
|---|---|---|---|
| 4,876,210 | A | 10/1989 | Barnett et al. |
| 4,948,456 | A | 8/1990 | Schubert |
| 4,963,508 | A | 10/1990 | Umeno et al. |
| 5,032,893 | A | 7/1991 | Fitzgerald, Jr. et al. |
| 5,034,337 | A | 7/1991 | Mosher et al. |
| 5,061,644 | A | 10/1991 | Yue et al. |
| 5,079,616 | A | 1/1992 | Yacobi et al. |
| 5,091,333 | A | 2/1992 | Fan et al. |
| 5,091,767 | A | 2/1992 | Bean et al. |
| 5,093,699 | A | 3/1992 | Weichold et al. |
| 5,098,850 | A | 3/1992 | Nishida et al. |
| 5,105,247 | A | 4/1992 | Cavanaugh |
| 5,108,947 | A | 4/1992 | Demeester et al. |
| 5,156,995 | A | 10/1992 | Fitzgerald, Jr. et al. |
| 5,159,413 | A | 10/1992 | Calviello et al. |
| 5,164,359 | A | 11/1992 | Calviello et al. |
| 5,166,767 | A | 11/1992 | Kapoor et al. |
| 5,223,043 | A | 6/1993 | Olson et al. |
| 5,236,546 | A | 8/1993 | Mizutani |
| 5,238,869 | A | 8/1993 | Shichijo et al. |
| 5,256,594 | A | 10/1993 | Wu et al. |
| 5,269,852 | A | 12/1993 | Nishida |
| 5,269,876 | A | 12/1993 | Mizutani |
| 5,272,105 | A | 12/1993 | Yacobi et al. |
| 5,281,283 | A | 1/1994 | Tokunaga et al. |
| 5,285,086 | A * | 2/1994 | Fitzgerald, Jr. ............... 257/85 |
| 5,295,150 | A | 3/1994 | Vangieson et al. |
| 5,356,831 | A | 10/1994 | Calviello et al. |
| 5,403,751 | A | 4/1995 | Nishida et al. |
| 5,405,453 | A | 4/1995 | Ho et al. |
| 5,407,491 | A | 4/1995 | Freundlich et al. |
| 5,410,167 | A | 4/1995 | Saito |
| 5,417,180 | A | 5/1995 | Nakamura |
| 5,427,976 | A | 6/1995 | Koh et al. |
| 5,432,120 | A | 7/1995 | Meister et al. |
| 5,438,018 | A | 8/1995 | Mori et al. |
| 5,461,243 | A | 10/1995 | Ek et al. |
| 5,518,953 | A | 5/1996 | Takasu |
| 5,528,209 | A | 6/1996 | MacDonald et al. |
| 5,545,586 | A | 8/1996 | Koh |
| 5,548,129 | A | 8/1996 | Kubena |
| 5,589,696 | A | 12/1996 | Baba |
| 5,621,227 | A | 4/1997 | Joshi |
| 5,622,891 | A | 4/1997 | Saito |
| 5,640,022 | A | 6/1997 | Inai |
| 5,710,436 | A | 1/1998 | Tanamoto et al. |
| 5,717,709 | A | 2/1998 | Sasaki et al. |
| 5,792,679 | A | 8/1998 | Nakato |
| 5,825,049 | A | 10/1998 | Simmons et al. |
| 5,825,240 | A | 10/1998 | Geis et al. |
| 5,849,077 | A | 12/1998 | Kenney |
| 5,853,497 | A | 12/1998 | Lillington et al. |
| 5,869,845 | A | 2/1999 | Vander Wagt et al. |
| 5,883,549 | A | 3/1999 | De Los Santos |
| 5,886,385 | A | 3/1999 | Arisumi et al. |
| 5,903,170 | A | 5/1999 | Kulkarni et al. |
| 5,953,361 | A | 9/1999 | Borchert et al. |
| 5,959,308 | A | 9/1999 | Shichijo et al. |
| 5,966,620 | A | 10/1999 | Sakaguchi et al. |
| 5,998,781 | A | 12/1999 | Vawter et al. |
| 6,011,271 | A | 1/2000 | Sakuma et al. |
| 6,015,979 | A | 1/2000 | Sugiura et al. |
| 6,049,098 | A | 4/2000 | Sato |
| 6,083,598 | A | 7/2000 | Ohkubo et al. |
| 6,100,106 | A | 8/2000 | Yamaguchi et al. |
| 6,110,813 | A | 8/2000 | Ota et al. |
| 6,111,288 | A | 8/2000 | Watanabe et al. |
| 6,121,542 | A | 9/2000 | Shiotsuka et al. |
| 6,150,242 | A | 11/2000 | Van de Wagt et al. |
| 6,153,010 | A | 11/2000 | Kiyoku et al. |
| 6,184,144 | B1 * | 2/2001 | Lo ............................... 438/703 |
| 6,191,432 | B1 | 2/2001 | Sugiyama et al. |
| 6,225,650 | B1 | 5/2001 | Tadatomo et al. |
| 6,228,691 | B1 | 5/2001 | Doyle |
| 6,229,153 | B1 | 5/2001 | Botez et al. |
| 6,235,547 | B1 | 5/2001 | Sakuma et al. |
| 6,252,261 | B1 | 6/2001 | Usui et al. |
| 6,252,287 | B1 | 6/2001 | Kurtz et al. |
| 6,271,551 | B1 | 8/2001 | Schmitz et al. |
| 6,274,889 | B1 | 8/2001 | Ota et al. |
| 6,300,650 | B1 | 10/2001 | Sato |
| 6,320,220 | B1 | 11/2001 | Watanabe et al. |
| 6,325,850 | B1 | 12/2001 | Beaumont et al. |
| 6,339,232 | B1 | 1/2002 | Takagi |
| 6,342,404 | B1 | 1/2002 | Shibata et al. |
| 6,348,096 | B1 | 2/2002 | Sunakawa et al. |
| 6,352,942 | B1 | 3/2002 | Luan et al. |
| 6,362,071 | B1 | 3/2002 | Nguyen et al. |
| 6,380,051 | B1 | 4/2002 | Yuasa et al. |
| 6,380,590 | B1 | 4/2002 | Yu |
| 6,403,451 | B1 | 6/2002 | Linthicum et al. |
| 6,407,425 | B1 | 6/2002 | Babcock et al. |
| 6,424,044 | B1 * | 7/2002 | Han et al. ....................... 257/758 |
| 6,456,214 | B1 | 9/2002 | van de Wagt |
| 6,458,614 | B1 | 10/2002 | Nanishi et al. |
| 6,475,869 | B1 | 11/2002 | Yu |
| 6,492,216 | B1 | 12/2002 | Yeo et al. |
| 6,500,257 | B1 | 12/2002 | Wang et al. |
| 6,503,610 | B2 | 1/2003 | Hiramatsu et al. |
| 6,512,252 | B1 | 1/2003 | Takagi et al. |
| 6,521,514 | B1 | 2/2003 | Gehrke et al. |
| 6,552,259 | B1 | 4/2003 | Hosomi et al. |
| 6,566,284 | B2 | 5/2003 | Thomas, III et al. |
| 6,576,532 | B1 | 6/2003 | Jones et al. |
| 6,579,463 | B1 | 6/2003 | Winningham et al. |
| 6,593,641 | B1 * | 7/2003 | Fitzgerald ....................... 257/616 |
| 6,603,172 | B1 | 8/2003 | Segawa et al. |
| 6,606,335 | B1 | 8/2003 | Kuramata et al. |
| 6,617,643 | B1 | 9/2003 | Goodwin-Johansson |
| 6,635,110 | B1 | 10/2003 | Luan et al. |
| 6,645,295 | B1 | 11/2003 | Koike et al. |
| 6,645,797 | B1 | 11/2003 | Buynoski et al. |
| 6,686,245 | B1 | 2/2004 | Mathew et al. |
| 6,703,253 | B2 | 3/2004 | Koide |
| 6,709,982 | B1 | 3/2004 | Buynoski et al. |
| 6,710,368 | B2 | 3/2004 | Fisher et al. |
| 6,720,196 | B2 | 4/2004 | Kunisato et al. |
| 6,727,523 | B2 | 4/2004 | Morita |
| 6,753,555 | B2 | 6/2004 | Takagi et al. |
| 6,756,611 | B2 * | 6/2004 | Kiyoku et al. ................. 257/103 |
| 6,762,483 | B1 | 7/2004 | Krivokapic et al. |
| 6,767,793 | B2 | 7/2004 | Clark et al. |
| 6,784,074 | B2 | 8/2004 | Shchukin et al. |
| 6,787,864 | B2 | 9/2004 | Paton et al. |
| 6,794,718 | B2 | 9/2004 | Nowak et al. |
| 6,800,910 | B2 | 10/2004 | Lin et al. |
| 6,803,598 | B1 | 10/2004 | Berger et al. |
| 6,809,351 | B2 | 10/2004 | Kuramoto et al. |
| 6,812,053 | B1 | 11/2004 | Kong et al. |
| 6,812,495 | B2 | 11/2004 | Wada et al. |
| 6,815,241 | B2 | 11/2004 | Wang |
| 6,815,738 | B2 | 11/2004 | Rim |
| 6,825,534 | B2 | 11/2004 | Chen et al. |
| 6,831,350 | B1 | 12/2004 | Liu et al. |
| 6,835,246 | B2 | 12/2004 | Zaidi |
| 6,835,618 | B1 | 12/2004 | Dakshina-Murthy et al. |
| 6,838,322 | B2 | 1/2005 | Pham et al. |
| 6,841,410 | B2 | 1/2005 | Sasaoka |
| 6,841,808 | B2 | 1/2005 | Shibata et al. |
| 6,849,077 | B2 | 2/2005 | Ricci |
| 6,849,487 | B2 | 2/2005 | Taylor, Jr. et al. |
| 6,849,884 | B2 | 2/2005 | Clark et al. |
| 6,855,583 | B1 | 2/2005 | Krivokapic et al. |
| 6,855,982 | B1 | 2/2005 | Xiang et al. |
| 6,855,990 | B2 | 2/2005 | Yeo et al. |
| 6,867,433 | B2 | 3/2005 | Yeo et al. |
| 6,873,009 | B2 | 3/2005 | Hisamoto et al. |
| 6,882,051 | B2 | 4/2005 | Majumdar et al. |
| 6,887,773 | B2 | 5/2005 | Gunn, III et al. |
| 6,888,181 | B1 | 5/2005 | Liao et al. |
| 6,900,070 | B2 | 5/2005 | Craven et al. |
| 6,900,502 | B2 | 5/2005 | Ge et al. |
| 6,902,965 | B2 | 6/2005 | Ge et al. |
| 6,902,991 | B2 | 6/2005 | Xiang et al. |

(56) References Cited

U.S. PATENT DOCUMENTS

| | | |
|---|---|---|
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 * | 9/2008 | Langdo et al. ............... 257/18 |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 * | 11/2002 | Kuramoto et al. ............ 438/604 |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 * | 8/2003 | Koide et al. ................. 257/200 |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 * | 10/2003 | Shchukin et al. ............... 438/77 |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 * | 6/2004 | Bude et al. ..................... 438/93 |
| 2004/0123796 A1 | 7/2004 | Nagai et al. |
| 2004/0142503 A1 | 7/2004 | Lee et al. |
| 2004/0150001 A1 * | 8/2004 | Shchukin et al. ............. 257/183 |
| 2004/0155249 A1 | 8/2004 | Narui et al. |
| 2004/0157412 A1 * | 8/2004 | Seifert .......................... 438/478 |
| 2004/0161947 A1 * | 8/2004 | Fitzgerald .................... 438/778 |
| 2004/0173812 A1 | 9/2004 | Currie et al. |
| 2004/0183078 A1 | 9/2004 | Wang |
| 2004/0185665 A1 * | 9/2004 | Kishimoto et al. ........... 438/689 |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |

(56) References Cited

U.S. PATENT DOCUMENTS

| | | |
|---|---|---|
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093099 A1* | 5/2005 | Koike et al. ............ 257/615 |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1* | 3/2006 | Bude et al. ............ 438/481 |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |

(56) References Cited

FOREIGN PATENT DOCUMENTS

| WO | WO0072383 | 11/2000 |
|---|---|---|
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.

68 Applied Physics Letters 7, 1999, pp. 774-779 (trans. of relevant portions attached).

Ames, "Intel Says More Efficient Chips are Coming," PC World, available at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE 17th International, 2000, pp. 109-110.

Asaoka, et al., "Observation of 1 f $^x$/noise of GaInP/GaAs triple barrier resonant tunneling diodes, " AIP Conf. Proc., vol. 780, Issue 1, 2005, pp. 492-495.

Ashby, et al., "Low-dislocation-density GaN from a single growth on a textured substrate," Applied Physics Letters, vol. 77, No. 20, Nov. 13, 2000, pp. 3233-3235.

Ashley, et al., "Heterogeneous InSb Quantum Well Transistors on Silicon for Ultra-High Speed, Low Power Logic Applications" 43 Electronics Letters, Jul. 14, 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{1-x}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Bushroa et al., "Lateral epitaxial overgrowth and reduction in defect density of 3C-SiC on patterned Si substrates," Journal of Crystal Growth, vol. 271, No. 1-2, Oct. 15 2004, pp. 200-206.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, 1995, pp. 235-241.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_xIn_{1-x}P$," Japan Journal of Applied Physics, vol. 33, 1994, pp. 4812-4819.

Chang et al. "3-D simulation of strained Si/SiGe heterojunction FinFETs" Semiconductor Device Research Symposium, Dec. 10-12, 2003, pp. 176-177.

Chang et al., "Effect of growth temperature on epitaxial lateral overgrowth of GaAs on Si substrate," Journal of Crystal Growth, vol. 174, No. 1-4, Apr. 1997, pp. 630-634.

Chang et al., "Epitaxial Lateral Overgrowth of Wide Dislocation-Free GaAs on Si Substrates," Electrochemical Society Proceedings, vol. 97-21, May 13, 1998, pp. 196-200.

Chau et al., Opportunities and Challenges of III-V Nanoelectronics for Future High-Speed, Low Power Logic Applications, IEEE CSIC Digest, 2005, pp. 17-20.

Chen et al., "Dislocation reduction in GaN thin films via lateral overgrowth from trenches," Applied Physics Letters, vol. 75, No. 14, Oct. 4 1999, pp. 2062-2063.

Chengrong, et al., "DBRTD with a high PVCR and a peak current density at room temperature," Chinese Journal of Semiconductors vol. 26, No. 10, Oct. 2005, pp. 1871-1874.

Choi et al., "Monolithic Integration GaAs/AlGaAs LED and Si Driver Circuit," 9 Electron Device Letters 10, Oct. 1988, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

Choi et al., "Monolithic Integration of Si MOSFETs and GaAs MESFETs," Electron Device Letters, vol. EDL-7, No. 4, Apr. 1986, 3 pages.

Choi, et al., "Low-voltage low-power K-band balanced RTD-based MMIC VCO," 2006 IEEE, Department of EECS, Korea Advanced Institute of Science and Technology, 2006, pp. 743-746.

Cloutier et al., "Optical gain and stimulated emission in periodic nanopatterned crystalline silicon," Nature Materials, Nov. 2005, 5 pages.

Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.

Dadgar et al., "MOVPE growth of GaN on Si (111) substrates," Journal of Crystal Growth, vol. 248, Feb. 1, 2003, pp. 556-562.

Datta et al., "Silicon and III-V Nanoelectronics," IEEE International Conference on Indium Phosphide & Related Materials, 2005, pp. 7-8.

Datta et al., "Ultrahigh-Speed 0.5 V Supply Voltage In0.7Ga0.3As Quantum-Well Transistors on Silicon Substrate," 28 Electron Device Letters 8, 2007, pp. 685-687.

Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.

De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.

(56) References Cited

OTHER PUBLICATIONS

Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office on Dec. 15, 2010 in European Patent Application No. 10002884.4 (10 pages).
Examination Report in European Patent Application No. 06800414.2, mailed Mar. 5, 2009, 3 pages.
Fang et al., "Electrically pumped hybrid AlGaInAs—silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_xSi_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. Jan. 1, 2006, pp. 5-23A.
Gallas et al., "Influence of Doping on Facet Formation at the $SiO_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed $Ge_xSi_{1-x}$ grown by heteroepitaxial lateral overgrowth," Journal of Crystal Growth 141, 1994, pp. 363-370.
Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.
International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2008, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.

(56) References Cited

OTHER PUBLICATIONS

International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

(56) References Cited

OTHER PUBLICATIONS

Li et al., "Selective Growth of Ge on Si (100) through Vias of $SiO_2$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.
Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XI, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 21, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs,"44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.
Matthews et al., "Defects in Epitaxial Multilayers—Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AlN Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Fabrication of Low-Defectivity, Compressively Strained Ge on $Si_{0.2}G^e{}_{0.8}$ Structures Using Aspect Ratio Trapping," Journal of The Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.

(56) References Cited

OTHER PUBLICATIONS

Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: 27$^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters Sep. 9, 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group 111-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l SOI Conf., pp. 110-111.
Suhara, et al, "Characterization of argon fast atom beam source and its application to the fabrication of resonant tunneling diodes," 2005 International Microprocesses and Nanotechnology Conf. Di. of Papers, 2005, pp. 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. 14$^{th}$, 2002, pp. 339-342.
Sun et al., "Sulfur Doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30$^{th}$ International Conference on Infrared and Millimeter Waves & 13$^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.

(56) References Cited

OTHER PUBLICATIONS

Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/Si$_{1-x}$Ge$_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge Si$_x$Ge$_{1-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of Si$_{1-x}$Ge$_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.

Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-3.
Xie et al., "From Porous Si to Patterned Si Substrate: Can Misfit Strain Energy in a Continuous Heteroepitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN—InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans. On Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned SiO$_2$/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.
Zela et al., "Single-crystalline Ge Grown Epitaxially on Oxidized and Reduced Ge/Si (100) Islands," Journal of Crystal Growth, vol. 263, 2004, pp. 90-93.
Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

(56) References Cited

OTHER PUBLICATIONS

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

Stall et al., "A study of Ge/GaAs interfaces grown by molecular beam epitaxy", J. Appl. Phys. 52(6), Jun. 1981, pp. 4062-4069, School of Electrical Engineering and National Research and Resource Facility for Submicron Structures, Cornell University, Ithaca, New York.

Fischer et al., "Elastic stress relaxation in SiGe epilayers on patterned Si substrates", J. Appl. Phys. 75(1), Jan. 1, 1994, pp. 657-659, Institute of Semiconductor Physics, Walter-Korsing-Strasse 2, 15230 Frankfurt (Oder), Germany.

* cited by examiner

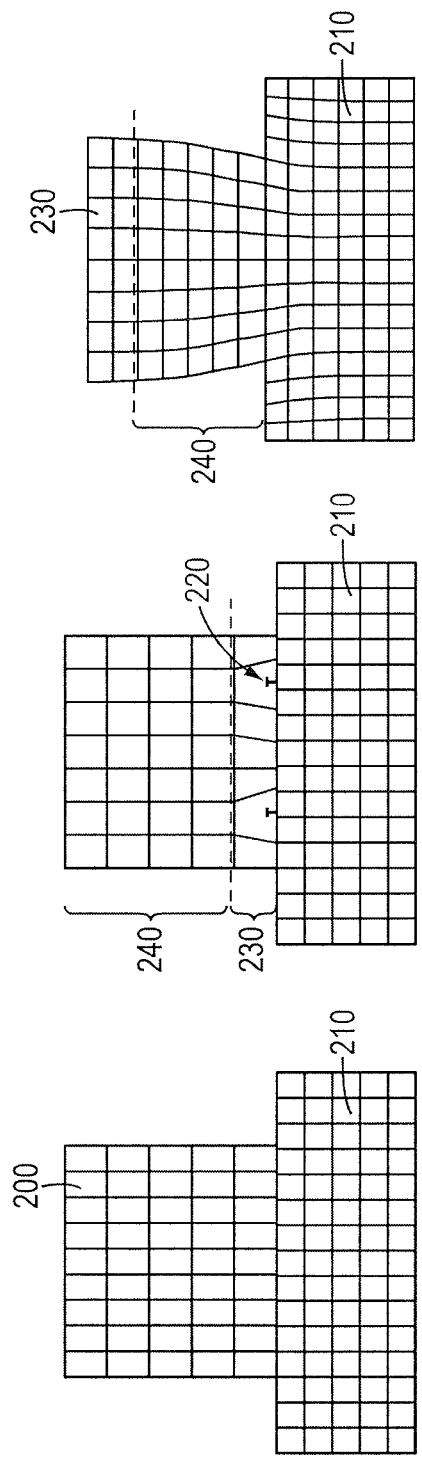

US 8,878,243 B2

LATTICE-MISMATCHED SEMICONDUCTOR STRUCTURES AND RELATED METHODS FOR DEVICE FABRICATION

RELATED APPLICATIONS

This application is a continuation of and claims the benefit of co-pending U.S. patent application Ser. No. 11/728,032, filed on Mar. 23, 2007, and entitled "Lattice-Mismatched Semiconductor Structures and Related Methods for Device Fabrication," which claims the benefit of and priority to U.S. Provisional Application Ser. No. 60/785,567, filed on Mar. 24, 2006, and entitled "Lattice-Mismatched Semiconductor Structures and Related Methods for Device Fabrication," which disclosures are hereby incorporated by reference in their entireties.

FIELD OF THE INVENTION

The technology disclosed herein relates generally to lattice-mismatched semiconductor heterostructures and, more specifically, to the selective epitaxial growth of the active-area material in connection with the integration of dissimilar semiconductor materials.

BACKGROUND

The increasing operating speeds and computing power of microelectronic devices have recently given rise to the need for an increase in the complexity and functionality of the semiconductor structures from which these devices are fabricated. Hetero-integration of dissimilar semiconductor materials, for example, III-V materials, such as gallium arsenide, gallium nitride, indium aluminum arsenide, and/or germanium with a silicon or silicon-germanium substrate, is an attractive path to increasing the functionality and performance of the CMOS platform. One technique for such integration is often referred to as "heteroepitaxial growth" or "heteroepitaxy," i.e. epitaxial growth of a semiconductor material over a semiconductor substrate, for example, by chemical vapor deposition ("CVD") or molecular beam epitaxy ("MBE"), where the semiconductor material, when fully relaxed, has a different lattice constant than the underlying substrate. In particular, heteroepitaxial growth can be advantageously employed to:

(i) fabricate semiconductor devices for which lattice-matched substrates are not commercially available, e.g. some types of ultra-high speed RF or optoelectronic devices;
(ii) combine multiple new materials on a single wafer, e.g. Ge for p-channel FET devices and InGaAs or InSb for n-channel FET devices;
(iii) improve performance of the conventional CMOS platform by replacing Si, in active areas of some or all transistors on a wafer, with semiconductor materials with higher mobility and saturation velocity than Si, i.e. Ge and/or III-V materials; and
(iv) achieve monolithic integration of semiconductor materials with large mismatch to Si with silicon microelectronics in a manner that is minimally, if at all, disruptive to the CMOS process.

Depending on the application, key considerations for using selective heteroepitaxy for fabrication of semiconductor devices include:

control of defect density, surface morphology, and degree of relaxation of the desired portions of heteroepitaxial regions;

ease of integration of heteroepitaxy into device manufacturing process; and reliability of electrical isolation of the defective regions from the active regions of the heterostructure.

Performance and, ultimately, the utility of devices fabricated using a combination of dissimilar semiconductor materials depend on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, dislocation defects can degrade physical properties of the device material and can lead to premature device failure.

As mentioned above, dislocation defects typically arise in efforts to epitaxially grow one kind of crystalline material on a substrate of a different kind of material—often referred to as "heterostructure"—due to different crystalline lattice sizes of the two materials. This lattice mismatch between the starting substrate and subsequent layer(s) creates stress during material deposition that generates dislocation defects in the semiconductor structure.

Misfit dislocations form at the mismatched interface to relieve the misfit strain. Many misfit dislocations have vertical components, termed "threading segments," which terminate at the surface. These threading segments continue through all semiconductor layers subsequently added to the heterostructure. In addition, dislocation defects can arise in the epitaxial growth of the same material as the underlying substrate where the substrate itself contains dislocations. Some of the dislocations replicate as threading dislocations in the epitaxially grown material. Such dislocations in the active regions of semiconductor devices such as diodes, lasers and transistors, may significantly degrade performance.

To reduce formation of dislocations and associated performance issues, many semiconductor heterostructure devices known in the art have been limited to semiconductor layers that have very closely—e.g. within 0.1%—lattice-matched crystal structures. In such devices, a thin layer is epitaxially grown on a mildly lattice-mismatched substrate. As long as the thickness of the epitaxial layer is kept below a critical thickness for defect formation, the substrate acts as a template for growth of the epitaxial layer, which elastically conforms to the substrate template. While lattice-matching (or near matching) eliminate dislocations in a number of structures, there are relatively few known lattice-matched systems, limiting the design options for new devices.

Accordingly, there is considerable interest in heterostructure devices involving greater epitaxial layer thickness and greater lattice misfit than known approaches may allow. For example, it has long been recognized that gallium arsenide grown on silicon substrates may permit a variety of new optoelectronic devices, combining the electronic processing technology of silicon VLSI circuits with the optical component technology available in gallium arsenide. See, for example, Choi et al, "Monolithic Integration of Si MOSFET's and GaAs MESFET's," IEEE Electron Device Letters, Vol. EDL-7, No. 4, April 1986, incorporated herein by reference. Highly advantageous results of such a combination include high-speed gallium arsenide circuits combined with complex silicon VLSI circuits, and gallium arsenide optoelectronic interface units to replace wire interconnects between silicon VLSI circuits. Progress has been made in integrating gallium arsenide and silicon devices. See, for example, Choi et al, "Monolithic Integration of GaAs/AlGaAs Double-Heterostructure LED's and Si MOSFET's"

IEEE Electron Device Letters, Vol. EDL-7, No. 9, September 1986; and Shichijo et al, "Co-Integration of GaAs MESFET and Si CMOS Circuits," IEEE Electron Device Letters, Vol. 9, No. 9, September 1988, both of which are incorporated herein by reference. However, despite the widely recognized potential advantages of such combined structures and substantial efforts to develop them, their practical utility has been limited by high defect densities in gallium arsenide layers grown on silicon substrates. See, for example, Choi et al, "Monolithic Integration of GaAs/AlGaAs LED and Si Driver Circuit," IEEE Electron Device Letters, Vol. 9, No. 10, October 1988 (p. 513), incorporated herein by reference. Thus, while basic techniques are known for integrating gallium arsenide and silicon devices, there exists a need for producing gallium arsenide layers having a low density of dislocation defects.

To control dislocation densities in highly-mismatched semiconductor layers, techniques such as wafer bonding and compositional grading have been explored.

Bonding of two different semiconductors may yield satisfactory material quality. Due to the limited availability and high cost of large size Ge or III-V wafers, however, the approach may not be practical.

Compositional grading also may yield satisfactory material quality for some applications, but requires growth of very thick epitaxial layers if substantial lattice mismatch is involved. For example, achieving high quality Ge on Si requires approximately 10 microns of epitaxial growth. Growing such thick layers may be costly and may also lead to large and deleterious thermal stresses due to differences between the thermal expansion coefficients of the substrate and epitaxial layer. For these reason, compositional grading method may not be practical for many applications.

Another known technique to control dislocations in highly-mismatched semiconductor layers, termed "epitaxial necking" or "aspect ratio trapping," was demonstrated in connection with fabricating a Ge-on-Si heterostructure by Langdo et al. in "High Quality Ge on Si by Epitaxial Necking," Applied Physics Letters, Vol. 76, No. 25, April 2000, and also by Park et al. in "Defect reduction of selective Ge epitaxy in trenches on Si (001) substrates using epitaxial necking," Applied Physics Letters, Vol. 90, 052113, February 2007, both of which are incorporated herein by reference. Relaxation of strain due to mismatched epitaxy can be accomplished by "plastic relaxation," i.e., relaxation through the nucleation of dislocations 100. The "epitaxial necking" technique focuses on confining these undesirable dislocations to the lower portion of a hole or trench, within a predetermined distance H of the substrate 110-epitaxy interface as shown in FIG. 1a. The semiconductor material grown above a distance H from the substrate can therefore be substantially defect free, and can serve as useful material for the fabrication of a semiconductor device. This approach offers process simplicity by utilizing a combination of selective epitaxial growth and defect crystallography to force defects to the sidewall of the opening in the patterning mask.

Specifically, as shown in FIG. 1b it has been observed experimentally that dislocations in a mismatched cubic semiconductor grown on a Si (100) surface in the near vicinity (e.g., within approximately 500 nm or less) of a vertical dielectric sidewall surface bend toward that surface at approximately 30 degrees through 60 degrees. For example, the dislocations may bend toward that surface at approximately a 45 degree angle to that surface. Based on this relationship, the predetermined distance H necessary to trap a substantial majority of dislocation defects is, typically, approximately equal to a width between ½ w and 2 w, where w is the width of the trench. This range is based on the noted range of intersection angles of approximately 30 degrees through 60 degrees, leading to: $\tan(30°)w \leq H \leq \tan(60°)w$, which roughly corresponds to $½w \leq H \leq 2$ w. Determination of more precise values of H for given semiconductor and substrate combinations, and for given hole or trench dimensions, sidewall materials, and sidewall orientations, is an area requiring more detailed study. For the specific case of Ge grown on (100) Si within trenches oriented along <110> directions with $SiO_2$ sidewalls, H is approximately equal to w (see Park et al., cited above). However, there are limitations to this technique. First, the size of the area for which this technique can successfully trap dislocations is restricted, as noted in the above relation between H and w. This may restrict practical use of epitaxial necking to applications involving relatively small semiconductor devices. Second, the presence of dislocations in the lower portion of the trench or hole may not be acceptable for some device applications, unless a way is found to keep the active regions of a semiconductor device electrically isolated from the dislocations. For some applications, their presence may not be acceptable in any case, and so a means of selective growth that avoids such dislocations (i.e., dislocations associated with plastic relaxation) entirely is highly desirable.

Thus, there is a need in the art for versatile and efficient methods of fabricating semiconductor heterostructures that constrain substrate interface defects in a variety of lattice-mismatched materials systems. There is also a need in the art for semiconductor devices utilizing a combination of integrated lattice-mismatched materials with reduced levels of substrate interface defects for improved functionality and performance.

SUMMARY

Aspects of the technology disclosed herein provide semiconductor heterostructures with significantly reduced interface defects, and methods for their fabrication that address limitations of known techniques. In its various aspects and implementations, the technology disclosed herein enables fabrication of semiconductor heterostructures including limited-area regions having upper surfaces substantially exhausted (or having tolerable concentrations) of threading dislocations. As a result, fabrication of semiconductor devices based on monolithic lattice-mismatched heterostructures long sought in the art but heretofore impractical due to dislocation defects may be realized.

In particular applications, aspects of the present technology feature semiconductor structures of Ge or III-V devices integrated with a Si substrate, such as, for example, gallium arsenide formed on a silicon substrate, as well as methods of producing semiconductor structures that contemplate integrating Ge or III-V materials on selected areas on a Si substrate.

In general, in one aspect, the technology disclosed herein features a method of forming a semiconductor heterostructure. The method includes providing a substrate that contains, or consists essentially of, a first semiconductor material, and then providing a dielectric mask thereover to define a seed window extending to the surface of the substrate. A second semiconductor material, lattice-mismatched to the underlying substrate, is epitaxially grown within and out of the seed window, laterally expanding over the mask, such that the lattice mismatch is at least partially accommodated within a portion of the second semiconductor material by elastic relaxation.

In another aspect, the present technology features a method of forming a semiconductor heterostructure that begins with providing a substrate including a first semiconductor material. The method additionally includes providing a dielectric mask thereover to define a self-assembled array of apertures extending to the surface of the substrate. A second semiconductor material, lattice-mismatched to the underlying substrate, is epitaxially grown within and out of the apertures, laterally expanding over the mask. Threading dislocations in the second semiconductor material decrease in density with increasing distance from the surface of the substrate.

Generally, in yet another aspect, the present technology provides a method of forming a semiconductor heterostructure that begins with providing a substrate including a first semiconductor material. The method additionally includes providing a self-assembled plurality of dielectric pillars extending from the surface of the substrate. A second semiconductor material, lattice-mismatched to the underlying substrate, is epitaxially grown over the substrate between the pillars, such that threading dislocations in the second semiconductor material decrease in density with increasing distance from the surface of the substrate.

In a further aspect, the technology disclosed herein contemplates a method of forming a semiconductor heterostructure. The method includes providing a substrate that contains, or consists essentially of, a first semiconductor material, and then providing a dielectric mask thereover to define a seed window extending to the surface of the substrate. The method additionally includes removing a portion of the surface of the substrate exposed within the window, thereby defining a notch, and then epitaxially depositing, in the window over the portion of the surface, a second semiconductor material having a hexagonal crystalline lattice, such that threading dislocations in the second semiconductor material decrease in density with increasing distance from the surface of the substrate.

In other aspects, the present technology features methods for electrical isolation of defective areas of heteroepitaxial region formed over the substrate from non-defective areas by forming a homo- or heterojunction within the heteroepitaxial region, and methods for control of surface characteristics of heteroepitaxial regions. Electronic and optoelectronic devices fabricated over the semiconductor heterostructures referenced above are also contemplated, as discussed in more detail below.

In an aspect, the invention features a structure including lattice-mismatched materials. The structure includes a substrate including a first crystalline material and having a top substrate surface. A non-crystalline mask layer is disposed above the substrate, the non-crystalline mask layer having a top surface and an opening defined by sidewalls extending from the top surface of the non-crystalline mask layer to the top substrate surface. A second crystalline material is disposed in the opening, the second crystalline material having a lattice mismatch to the first crystalline material and a thickness sufficient to permit a majority of defects arising from the lattice mismatch to exit the second crystalline material at the sidewalls. A third crystalline material is disposed above the second crystalline material and defines a junction therebetween the second crystalline material and the third crystalline material, the junction confining selected charge carriers to one side of the junction.

One or more of the following features may be included. The second crystalline material may include a first semiconductor material having a first doping type and a first doping level, the third crystalline material may include a second semiconductor material having a second doping type and a second doping level, with the first and second doping types being the same, and the first and second doping levels being different.

The second crystalline material may include a first semiconductor material having a first doping type and the third crystalline material may include a second semiconductor material having a second doping type, with the first doping type being different from the second doping type.

The second crystalline material may include a first semiconductor material, the third crystalline material may include a second semiconductor material, and the first and second semiconductor materials may be different; optionally, the second and third crystalline materials may be substantially lattice matched.

The second and third crystalline materials may each comprise at least one III-V semiconductor compound. The second and third crystalline materials may form a type II heterojunction.

A device may be at least partially disposed over the third crystalline material. An active area of the device may include at least a portion of the third crystalline material. The device may be a MOSFET, a photo-sensitive device, a light emitting device, or a photovoltaic device.

The confined selected charge carriers may include holes and/or electrons. The substrate may include Si. The mask layer may include $SiO_2$. The opening in the mask layer may include a substantially circular, substantially square, or substantially rectangular cross-section; the opening may comprise an elongated trench. The sidewalls of the opening may be substantially perpendicular to a top substrate surface. The third crystalline material may includes a top surface that is substantially coplanar with the top surface of the mask layer.

In another aspect, the invention features a structure including lattice-mismatched materials. The structure includes a substrate including a first crystalline semiconductor material. A second crystalline semiconductor material having a lattice mismatch to the substrate is disposed on the substrate in a predetermined configuration defining a top surface and a lateral sidewall surface extending from a top surface of the substrate to the top surface defined by the predetermined configuration. The sidewall surface has a height above the substrate top surface sufficient to permit a majority of defects arising from the lattice mismatch to exit the second crystalline semiconductor material at the lateral sidewall surface. A third crystalline semiconductor material substantially lattice matched with the second crystalline material, the third crystalline material being disposed on at least a portion of the sidewall surface of the second material to define an outer sidewall surface.

The lateral sidewall surface may include a column defining a generally circular or generally square cross-section. The lateral sidewall surface may define an elongated cross-section parallel to a top surface of the substrate, the elongated cross section length being more than twice its width. The third crystalline semiconductor material may have a bandgap wider than a bandgap of the second crystalline semiconductor material. An insulating material may be disposed adjacent to and in contact with at least a portion of the lateral sidewall surface. The insulating material may have a height above the substrate greater than the height sufficient to permit a majority of defects arising from the lattice mismatch between the substrate and the second crystalline semiconductor material to exit the second crystalline semiconductor material at the lateral sidewall surface.

An insulating material may be disposed adjacent to and in contact with the outer sidewall surface. The insulating material and the second and third crystalline semiconductor materials may each define a respective planar top surface, and the planar top surfaces are substantially coplanar. The third crystalline semiconductor material may be disposed over substantially the entire lateral sidewall surface. The third crystalline semiconductor material may be disposed over the top surface of the second crystalline material to define an outer top surface.

An insulating material may be disposed over the outer sidewall surface. The insulating material and third crystalline semiconductor material may each defines a planar top surface, with the planar top surfaces being substantially coplanar.

The third crystalline semiconductor material may be disposed over the substrate adjacent the second crystalline semiconductor material.

The second crystalline semiconductor material may define a plurality of predetermined shapes, each shape having a top surface and a lateral sidewall surface extending from the substrate to the top surface, the sidewall surface having a height above the substrate sufficient to permit a majority of defects arising from the lattice mismatch to exit the second crystalline semiconductor material at the sidewall surface. The third crystalline semiconductor material may include a contiguous layer disposed on and in contact with the second crystalline semiconductor material.

The second and third crystalline semiconductor materials may define a heterojunction.

In another aspect, the invention features a structure including lattice-mismatched materials. The structure includes a substrate including a first crystalline semiconductor material. A mask layer is disposed above the substrate, the mask layer having a top surface and a plurality of openings defined by sidewalls extending through the mask layer from the top surface to the substrate. A second crystalline material is disposed within each of the openings and has a lattice mismatch to the first crystalline material and a thickness sufficient to permit a majority of defects arising from the lattice mismatch to exit the second material at the sidewalls. A third crystalline semiconductor material is disposed within the openings above the second crystalline material and defines a junction in each opening for confining selected charge carriers to one side of the junction.

The third crystalline material disposed within an opening is discontinuous with the third crystalline material disposed in other openings. The second and third crystalline materials may define heterojunctions within the plurality of openings, and a plurality of semiconductor device elements may be associated with the plurality of openings.

The he device elements comprise a photo-electric device element, a photo-emissive device element, and/or a photovoltaic device element.

The plurality of openings in the mask layer may define a rectangular array having spacings in an x-direction and in a y-direction. An array of photo-emissive device elements may be associated with the rectangular array of openings, and the spacings in each of the x- and the y-directions may be equal to an integer number of half wavelengths of a frequency of light emitted by the photo-emissive device elements.

In another aspect, the invention features a structure including lattice-mismatched materials. The structure includes a substrate comprising a first crystalline material. A first non-crystalline mask layer is disposed over the substrate, the first non-crystalline mask layer including a first window exposing at least a portion of the substrate. A second crystalline material is disposed in the window, the second crystalline material having a lattice mismatch to the first crystalline material, the lattice mismatch inducing strain in the second crystalline material. An area of the window exposing at least a portion of the substrate is sufficiently small to permit elastic relaxation of the second crystalline material without introduction of strain-related defects. A thickness of the second crystalline material is sufficiently high such that an inner region of the second crystalline material is partially relaxed and relieves strain from the lattice mismatch, and an outer region of the second crystalline material is substantially relaxed.

A semiconductor device may be disposed over the second crystalline material. An active area of the semiconductor device may include at least a portion of the second crystalline material. The first window may be defined by at least one sidewall substantially perpendicular to a top surface of the substrate. The first window may be defined by at least one sidewall substantially non-perpendicular to a top surface of the substrate. The first window may be defined by at least one sidewall including a plurality of regions, each region being at a different angle to a top surface of the substrate. The window may include a wider upper portion and a narrower lower portion. A second non-crystalline material may be disposed in the window.

Another aspect of the invention features a structure including lattice-mismatched materials. The structure includes a substrate including a first crystalline material. A non-crystalline mask layer is disposed above the substrate, the mask layer having a top surface and a plurality of openings defined by sidewalls extending from the top surface of the non-crystalline mask layer to a top surface of the substrate. A second crystalline material is disposed in the openings, the second crystalline material having a lattice mismatch to the first crystalline material and a thickness sufficient to permit a majority of defects arising from the lattice mismatch to exit the second material at the sidewalls. A third crystalline material is disposed above the second crystalline material, the third crystalline material disposed in each opening being non-contiguous with the third crystalline material disposed in other openings.

The structure may include a plurality of semiconductor devices, with each semiconductor device comprising an active region disposed in an opening in the mask layer. The plurality of semiconductor devices may be connected in parallel. The semiconductor devices may include an LED.

In another aspect, the invention features a structure including lattice-mismatched materials. The structure includes a substrate including a first crystalline material and having a top substrate surface. A non-crystalline mask layer is disposed above the substrate, the non-crystalline mask layer having a top surface and an opening defined by sidewalls extending from the top surface of the non-crystalline mask layer to the top substrate surface. A second crystalline material is disposed in the opening, the second crystalline material having a lattice mismatch to the first crystalline material and a thickness sufficient to permit a majority of defects arising from the lattice mismatch to exit the second crystalline material at the sidewalls. A third crystalline material is disposed above the second crystalline material and define a junction between the second crystalline material and the third crystalline material. The second and third crystalline materials are substantially lattice matched.

In another aspect, the invention features a structure including lattice-mismatched materials. The structure includes a substrate including a first crystalline semiconductor material. A mask layer is disposed above the substrate, the mask layer having a top surface and a plurality of openings defined by sidewalls extending through the mask layer from the top surface to the substrate. A second crystalline material is disposed within each of the openings and has a lattice mismatch to the first crystalline material and a thickness sufficient to permit a majority of defects arising from the lattice mismatch to exit the second material at the sidewalls. A third crystalline semiconductor material is disposed within the openings above the second crystalline material and defines a junction in each opening. The second and third crystalline materials are substantially lattice matched.

In another aspect, the invention features a method for forming a structure, including forming a non-crystalline mask layer over a top surface of a substrate including a first crystalline material, the non-crystalline mask layer having a top surface. An opening is formed in the non-crystalline mask layer, the opening including at least one sidewall extending from the top surface of the non-crystalline mask layer to the top surface of the substrate. A second crystalline material is introduced into the opening, the second crystalline material having a lattice mismatch to the first crystalline material and a thickness sufficient to permit a majority of defects arising from the lattice mismatch to exit the second crystalline material at the at least one sidewall. A third crystalline material is formed above the second crystalline material to define a junction between the second crystalline material and the third crystalline material. The junction is configured to confine selected charge carriers to one side of the junction.

In another aspect, the invention features a method for forming a structure including lattice-mismatched materials, the method including providing a substrate comprising a first crystalline semiconductor material. A layer is formed over the substrate, the layer (i) including a second crystalline semiconductor material having a lattice mismatch to the substrate and (ii) defining a predetermined shape having a top surface and a lateral sidewall surface extending from a top surface of the substrate to the top surface of the predetermined shape, the sidewall surface having a height above the top surface of the substrate sufficient to permit a majority of defects arising from the lattice mismatch to exit the second material at the lateral sidewall surface. A third crystalline semiconductor material substantially lattice matched with the second crystalline material is provided, the third crystalline material being disposed on at least a portion of the sidewall surface of the second material to define an outer sidewall surface.

In another aspect, the invention features a method for forming a structure including lattice-mismatched materials, the method including forming a mask layer above a substrate including a first crystalline semiconductor material, the mask layer having a top surface and a plurality of openings defined by sidewalls extending through the mask layer from the top surface to a top surface of the substrate. A second crystalline material is introduced into each of the openings, the second crystalline material having a lattice mismatch to the first crystalline material and a thickness sufficient to permit a majority of defects arising from the lattice mismatch to exit the second material at the sidewalls. A third crystalline semiconductor material is introduced into each of the openings above the second crystalline material, defining a junction in each opening configured to confine selected charge carriers to one side of the junction.

In another aspect, a method for forming a structure including lattice-mismatched materials includes forming a first non-crystalline mask layer over a substrate including a first crystalline material. A first window is defined in the first non-crystalline mask layer to expose at least a portion of the substrate. A second crystalline material is introduced into the window, the second crystalline material having a lattice mismatch to the first crystalline material, the lattice mismatch inducing strain in the second crystalline material. A area of the window exposing at least a portion of the substrate is sufficiently small to permit elastic relaxation of the second crystalline material without introduction of strain-related defects. A thickness of the second crystalline material is sufficiently high such that an inner region of the second crystalline material is partially relaxed and relieves strain from the lattice mismatch, and an outer region of the second crystalline material is substantially relaxed.

In yet another aspect, the invention features a method for forming a structure including lattice-mismatched materials. The method includes forming a non-crystalline mask layer over a substrate including a first crystalline material, the mask layer having a top surface. A plurality of openings are defined in the non-crystalline mask layer, each of the openings defined by sidewalls extending from the top surface of the non-crystalline mask layer to a top surface of the substrate. A second crystalline material is introduced into the openings, the second crystalline material having a lattice mismatch to the first crystalline material and a thickness sufficient to permit a majority of defects arising from the lattice mismatch to exit the second material at the sidewalls. A third crystalline material is introduced above the second crystalline material, such that the third crystalline material disposed in each opening is non-contiguous with the third crystalline material disposed in other openings.

In another aspect, the invention features a method for forming a structure, including forming a non-crystalline mask layer over a top surface of a substrate including a first crystalline material, the non-crystalline mask layer having a top surface. An opening is formed in the non-crystalline mask layer, the opening including at least one sidewall extending from the top surface of the non-crystalline mask layer to the top surface of the substrate. A second crystalline material is introduced into the opening, the second crystalline material having a lattice mismatch to the first crystalline material and a thickness sufficient to permit a majority of defects arising from the lattice mismatch to exit the second crystalline material at the at least one sidewall. A third crystalline material is introduced above the second crystalline material to define a junction between the second crystalline material and the third crystalline material. The second and third crystalline materials are substantially lattice matched.

BRIEF DESCRIPTION OF DRAWINGS

FIGS. 2A-2C are schematic cross-sectional views illustrating relaxation in lattice-mismatched materials systems;

DETAILED DESCRIPTION

Silicon (Si) is recognized as presently being the most ubiquitous semiconductor for the electronics industry. Most of silicon that is used to form silicon wafers is formed from single crystal silicon. Silicon wafers serve as the substrate on which CMOS devices are formed. The silicon wafers are also referred to as a semiconductor substrate or a semiconductor wafer. While described in connection with silicon substrates, however, the use of substrates that include, or consist essentially of, other semiconductor materials, is contemplated without departing from the spirit and scope of the present disclosure.

As mentioned above, in particular applications, the present technology features semiconductor structures of Ge or III-V devices integrated with a Si substrate, such as, for example, gallium arsenide formed on a silicon substrate. Other semiconductor materials, lattice-mismatched to the underlying substrate, can also be used, such as for example a group II, a group III, a group IV, a group V, and a group VI element, and combinations thereof, more particularly, germanium, silicon germanium, gallium arsenide, indium phosphide, indium gallium arsenide, indium gallium phosphide, gallium phosphide, gallium nitride, indium gallium nitride, aluminum gallium nitride, indium arsenide, indium antimonide, indium aluminum antimonide, gallium antimonide, and indium gallium antimonide. In some aspects and implementations of this technology, the lattice-mismatched semiconductor material is compositionally graded.

Figure 1A:
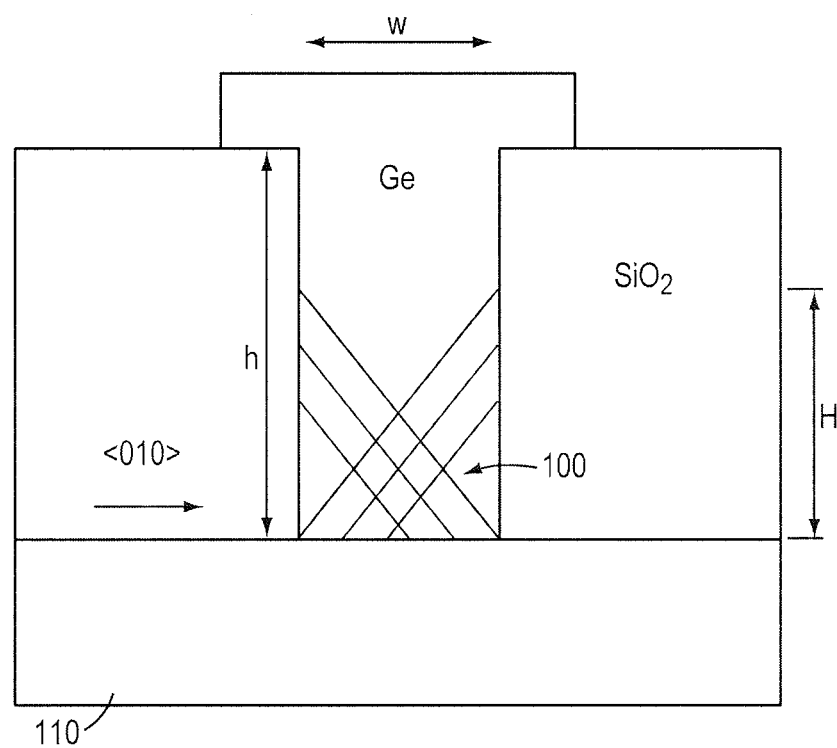
FIG. 1 is a schematic cross-sectional view illustrating a semiconductor heterostructure device composed of highly-mismatched deposited layers.
Figure 1B:
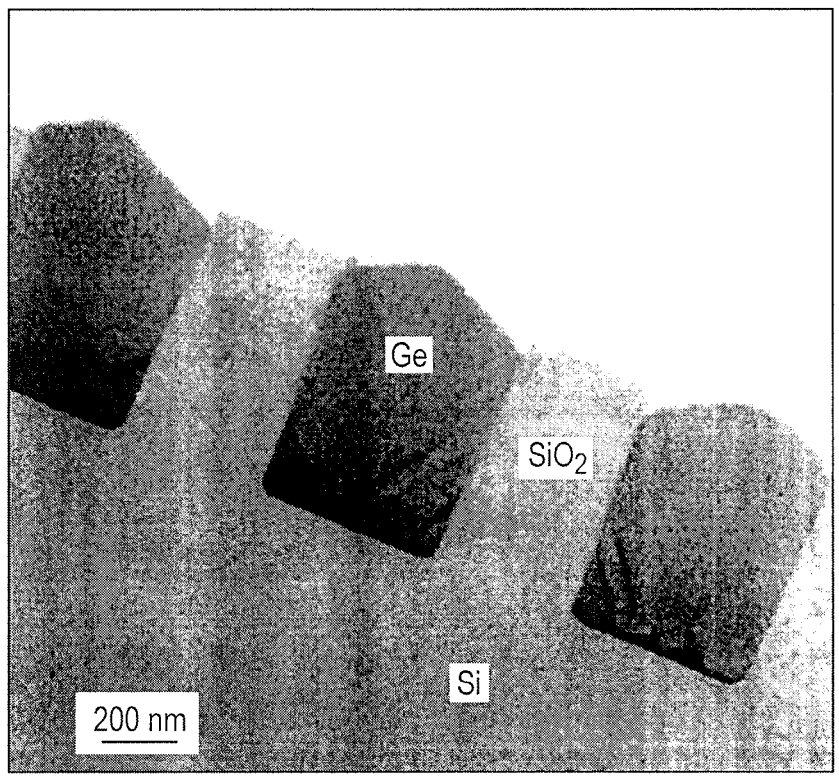

A. Utilizing Elastic Relaxation to Create Relaxed, Low-Defect Heteroepitaxial Regions As discussed above, there is a need in the art for versatile and efficient methods for fabricating semiconductor heterostructures that reduce dislocation defect densities in a variety of lattice-mismatched materials systems. As mentioned above and shown in FIG. 2A, many semiconductor heterostructure devices known in the art have been limited to semiconductor layers that have very closely—e.g. within 0.1%—lattice-matched crystal structures. In such devices a thin layer 200 is epitaxially grown on a mildly lattice-mismatched substrate 210. As long as the thickness of the epitaxial layer is kept below a critical thickness for defect formation, the substrate acts as a template for growth of the strained epitaxial layer. Thus, the heteroepitaxial layer is fully strained. Another technique mentioned above (shown in FIG. 1) that addresses control of threading dislocation densities in highly-mismatched deposited layers, termed "epitaxial necking," relies on plastic relaxation of the lattice-mismatched material proximate to its interface with the substrate; plastic relaxation is illustrated schematically in FIG. 2B. Misfit dislocations 220 relax strain in directions perpendicular to the dislocation line. Thus, an upper portion 230 of the hetero-epitaxial layer is fully relaxed, while a lower portion 240 is partially relaxed. As discussed above, conventional epitaxial necking is typically applicable only to devices with small lateral dimensions in order for the dislocations in the lattice-mismatched semiconductor layer to terminate at a sidewall of the trench. Yet another approach relies on elastic relaxation of the heteroepitaxial material, as shown in FIG. 2C, whereby substantially no defects are created at the interface with the substrate, and the partially relaxed lower portion 240 is thicker than the fully relaxed upper portion 230. This approach is generally applicably only for extremely small lateral dimensions of the heteroepitaxial region and/or very low mismatch with the underlying substrate. For example, for 4% lattice mismatch, such as for pure Ge grown over Si, a lateral dimension of the heteroepitaxial region is preferably be ≤20 nm to fully avoid plastic relaxation and defect formation. For other semiconductor combinations with even higher mismatch, the lateral dimension may need to be even smaller. For the case of epitaxial growth of $Si_{1-x}Ge_x$ on Si, constraints on mismatch and lateral dimensions for full relaxation without defects can be estimated from an article by Luryi and Suhir, published in Applied Physics Letters, Vol. 49 (3), page 140 (1986), incorporated herein by reference.

Figure 3:
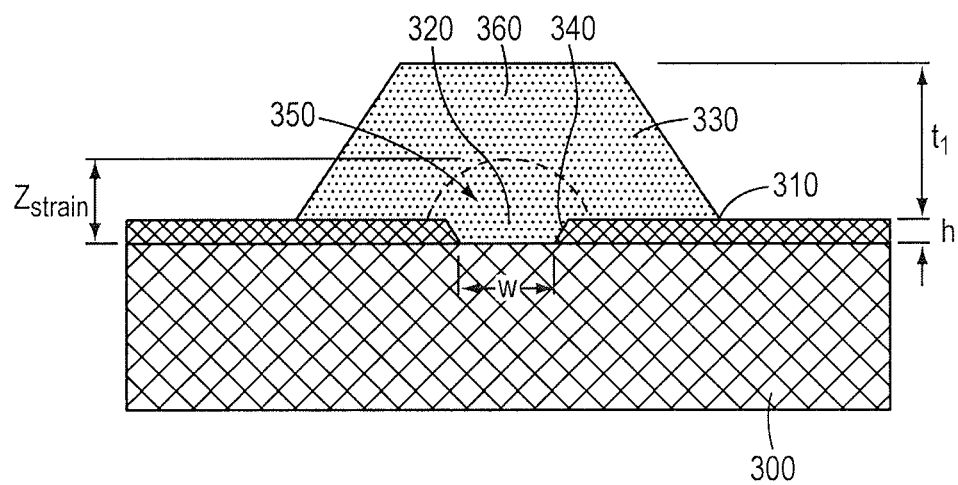
FIG. 3 is a schematic cross-sectional view illustrating a semiconductor heterostructure with a heteroepitaxial region having a substantially defect-free area, in accordance with an embodiment of the invention.

Referring now to FIG. 3, in some implementations of the inventive concepts described herein, an elastic relaxation technique is employed to create a substantially defect-free area of the heteroepitaxial region for fabrication of semiconductor devices. As shown in FIG. 3, a substrate 300 includes, or consists essentially of, a first crystalline material, e.g., a semiconductor such as silicon. A first non-crystalline mask layer 310 is disposed over the substrate. The first non-crystalline mask layer includes a first window 320, i.e., an opening or a trench, also referred to herein as a "seed window," extending to the surface of the substrate and exposing at least a portion of the substrate. The mask may include a dielectric material, such as, for example, silicon dioxide or silicon nitride.

A second crystalline material 330, e.g., a semiconductor, lattice-mismatched to the underlying substrate, is first deposited in the opening over the substrate, and then the epitaxial deposition continues such that a heteroepitaxial region is grown over the material disposed in the opening, laterally expanding over the mask. The lattice mismatch induces strain in the second crystalline material.

In various embodiments, the first crystalline material may include, or consist essentially of, silicon or a silicon germanium alloy. The second crystalline material may include, or consist essentially of, a group II, a group III, a group IV, a group V, and/or a group VI element, and/or combinations thereof, for example, germanium, silicon germanium, gallium arsenide, or gallium nitride.

If an area of the window exposing at least a portion of the substrate is sufficiently small, i.e., if the lateral dimension w of the opening is small enough, mismatch can be accommodated by elastic relaxation of the second crystalline material without introduction of strain-related defects, e.g., dislocations. This means that the aspect ratio (h/w) and sidewall angle of the opening generally do not need to be designed to trap dislocations, as in epitaxial necking approach described above. A sidewall 340 of the opening may be substantially perpendicular 340a to a top surface of the substrate. In another embodiment, the sidewall may be substantially non-perpendicular 340b to the substrate top surface (see FIG. 6A for a depiction of both embodiments). A thickness $t_1$ of the second crystalline material is sufficiently high such that an inner region 350 of the second crystalline material is partially relaxed and relieves strain from the lattice mismatch, and an outer region 360 of the second crystalline material is substantially relaxed.

The window may have two portions, a wider upper portion and a narrower lower portion (see discussion below with respect to FIGS. 6A-6C).

As shown in FIG. 3, $Z_{strain}$, the vertical extent of the substantially strained/partially relaxed epitaxial area is generally on the order of w. The upper portion of the heteroepitaxial region formed over this area is substantially relaxed and void of dislocation defects, and can advantageously be used for semiconductor device fabrication, e.g. as shown in FIGS. 6A-6B. A semiconductor device may disposed over the second crystalline material; in an embodiment, an active area of the semiconductor device includes at least a portion of the second crystalline material.

Figure 4:
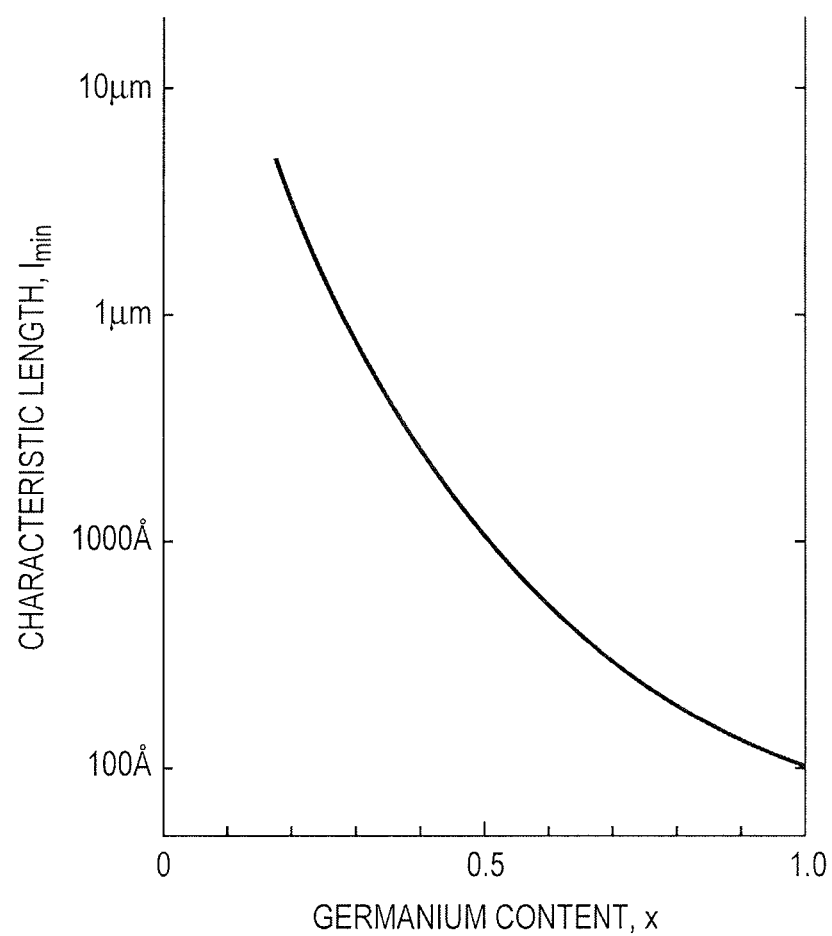
FIG. 4 is a graph enabling the calculation of the correlation between the thickness of a mask and the width of an opening for a particular application of $Si_{1-x}Ge_x$ deposited over Si.

Referring to FIG. 4, for a particular application of $Si_{1-x}Ge_x$ deposited over Si, the correlation between the width of the opening and germanium content x can be calculated using the graph from the article by Luryi and Suhir, mentioned above. Specifically, for all relaxation to occur elastically (so avoiding dislocation formation), the constraint on $w \leq 2 \times l_{min}$, where $l_{min}$ is the "characteristic length" which is a function of germanium content x as defined by Luryi and Suhir.

Figure 5:
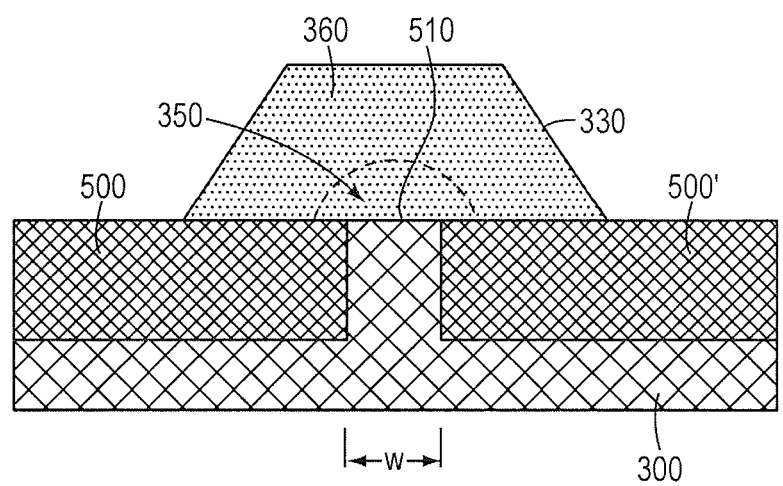
FIG. 5 is a schematic cross-sectional view illustrating a semiconductor heterostructure having insulator regions bounding a narrow portion of the top surface of a substrate surface, in accordance with an embodiment of the invention.

Referring to FIG. 5, in other implementations, insulator regions 500, 500' are formed in the top section of the substrate, leaving a narrow portion of the top surface 510 of the substrate exposed between and co-planar with the insulator regions. The lattice-mismatched semiconductor material is first epitaxially grown over the narrow portion of the substrate, and then the heteroepitaxy continues such that a heteroepitaxial region laterally expands over the insulator regions. As discussed above, the lateral dimension w of the narrow portion is small enough, such that the mismatch is accommodated by elastic relaxation. The upper portion of the heteroepitaxial region formed over this area is substantially relaxed and void of dislocation defects, and can advantageously be used for semiconductor device fabrication.

Figure 6A:
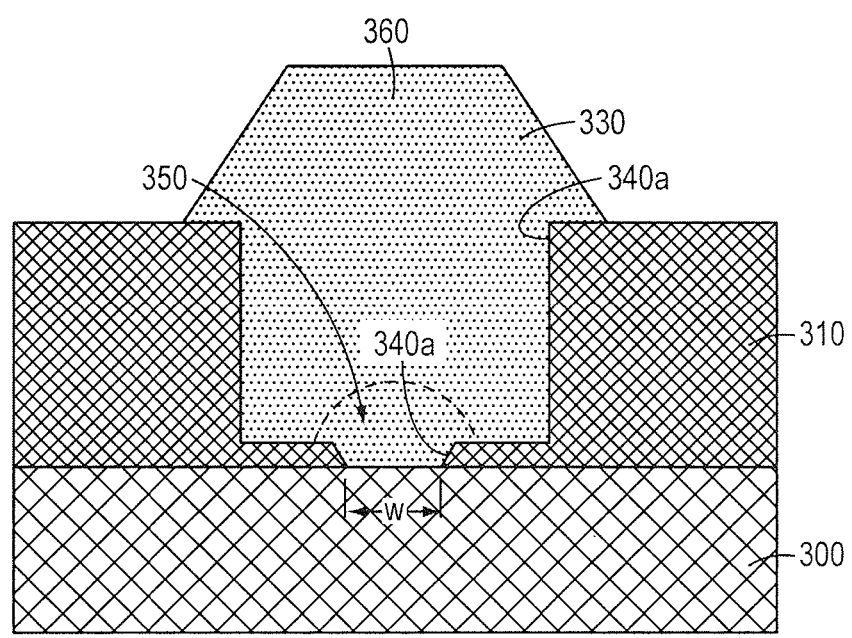
FIGS. 6A-6B are schematic cross-sectional views illustrating the fabrication of a planar MOSFET in an upper region of a heteroepitaxial region, in accordance with an embodiment of the invention.
Figure 6B:
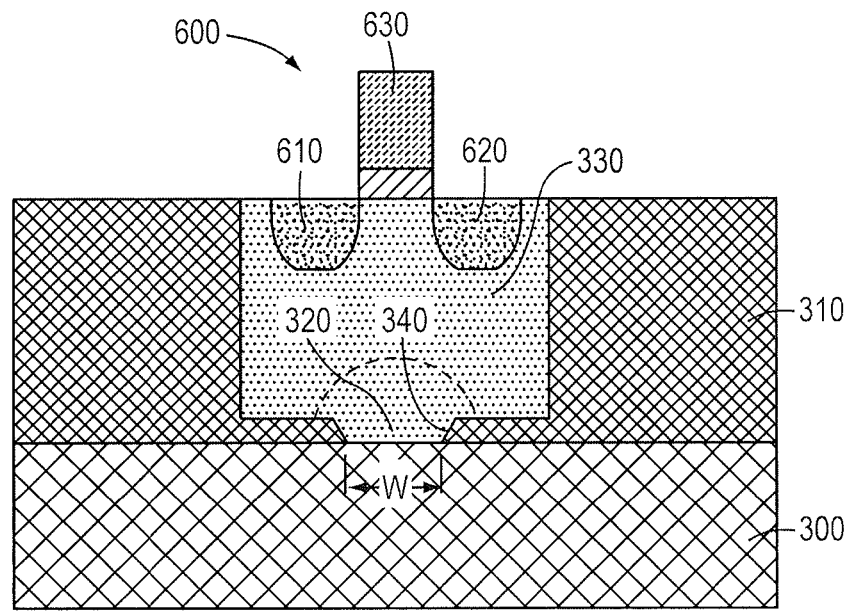
Figure 6C:
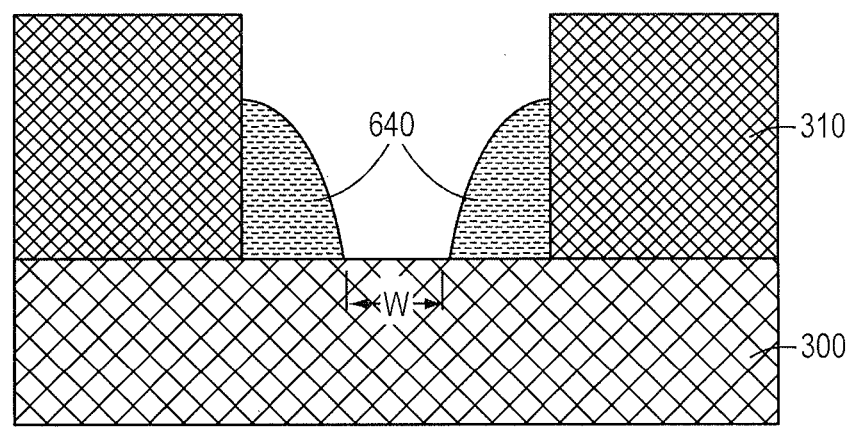
FIG. 6C is a schematic cross-sectional view illustrating a semiconductor heterostructure having a seed window with spacers, according to an embodiment of the invention.

Referring now to FIGS. 6A-6B, in some implementations, a planar MOSFET 600 including a source 610, a drain 620, and a gate 630, is fabricated in the upper portion of the heteroepitaxial region. Further to the discussion above in connection with FIG. 3, the fabrication entails:

Depositing or growing an insulator layer over a substrate;

Fabricating a seed window, e.g., a trench, with bottom width w narrow enough to allow substantial elastic relaxation w/o dislocations, for subsequent epitaxial deposition;

Epitaxially growing one or more lattice-mismatched semiconductor materials to be used for the active area of the MOSFET;

Planarizing an upper portion of the heteroepitaxial region, e.g. by chemical-mechanical polishing ("CMP"), creating a substantially planar active area; and then Fabricating MOSFET elements, including gate and source/drain regions.

The method described above in connection with FIGS. 3 and 6A-6B involves creating an opening or seed window with outward slanted sidewalls, i.e., a structure that is substantially narrower at the bottom than the top. In some implementations, such window is defined in the insulator layer by two lithography-and-etch cycles, e.g. making a wide opening/trench first, then making a narrower one inside. Alternatively, in other implementations, this can be achieved with only one lithography step, followed by spacer 640 deposition and etch, as shown in FIG. 6C. This technique is generally more economical and can alleviate lithographic alignment problems, or lithographic minimum feature limitations, inherent with the lithography-and-etch approach. The spacers can be formed from the same or different material than the insulator layer. For either case, selective epitaxial growth follows creation of the opening or trench.

Figure 7A:
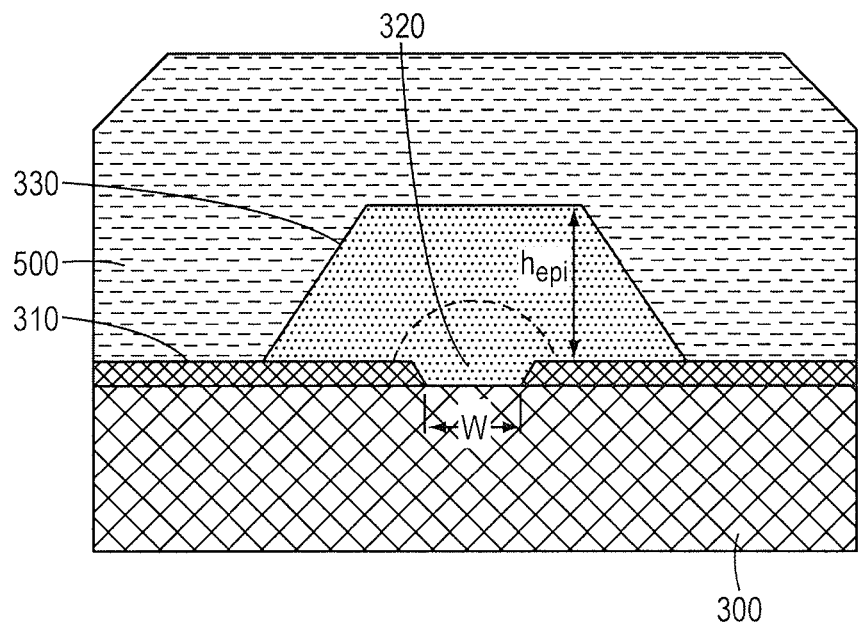
FIGS. 7A-7B are schematic cross-sectional views illustrating a method for forming a substantially defect-free area of an epitaxial region that is co-planar with an insulator region, according to an embodiment of the invention.
Figure 7B:
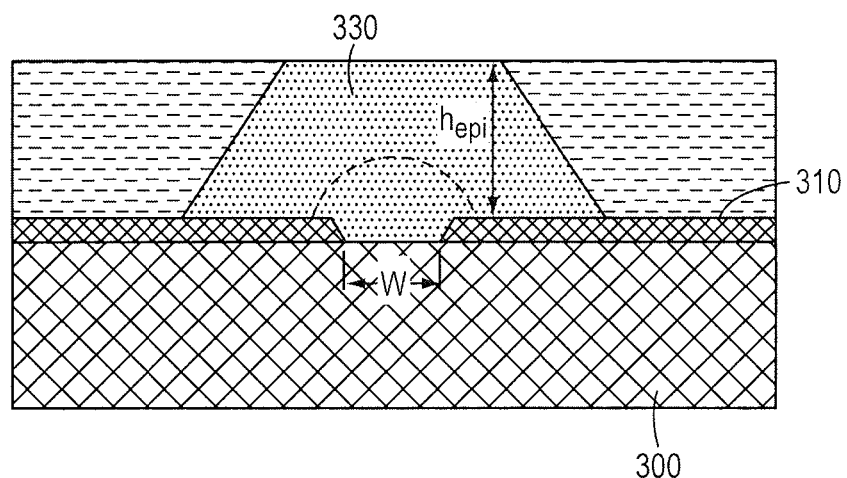

Referring now to FIGS. 7A-7B, in some implementations, a substantially defect-free area of the heteroepitaxial region for fabrication of semiconductor devices can be formed to be coplanar with an insulator region. Further to the discussion above in connection with FIG. 3, the fabrication entails:

Depositing or growing a first insulator layer on a substrate;

Fabricating a seed window, e.g. a trench, with bottom width w narrow enough to allow substantial elastic relaxation without dislocations, for subsequent epitaxial deposition;

Epitaxially growing one or more lattice-mismatched semiconductor materials to be used for the active area of the electronic device to a thickness of $h_{epi}$;

Depositing a second insulator layer to a thickness exceeding $h_{epi}$ (the second insulator layer can be formed from the same or different material than the first insulator layer);

Planarizing the heteroepitaxial region and the second insulator layer (e.g., via CMP) to form a planar active area, i.e. an active area co-planar with adjacent isolation regions; and then Fabricating the electronic device in the active area.

Figure 8A:
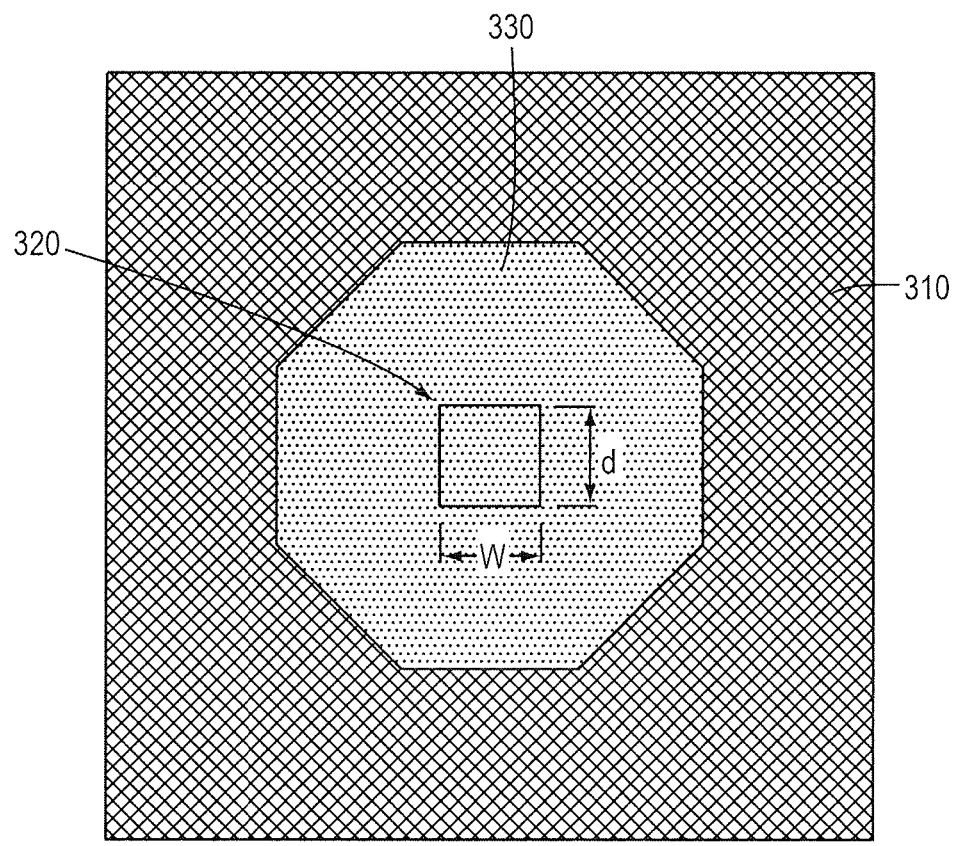
FIGS. 8, 9, and 10 are schematic top and cross-sectional views illustrating semiconductor heterostructures with seed windows of differing geometries, according to embodiments of the invention.
Figure 8B:
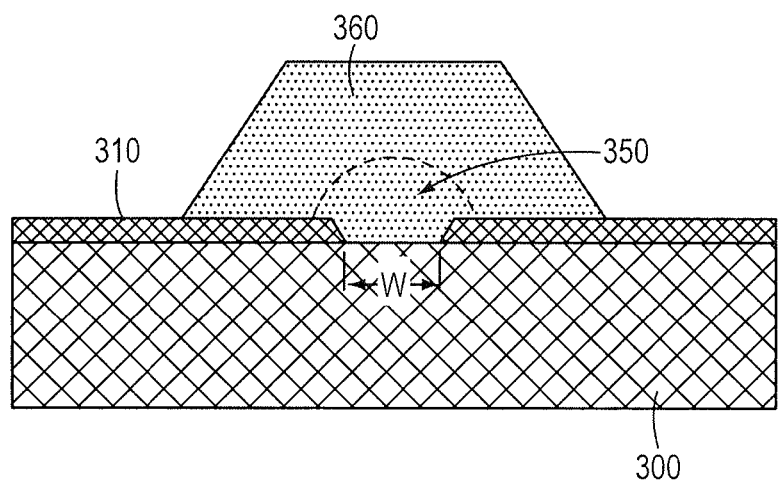
Figure 9A:
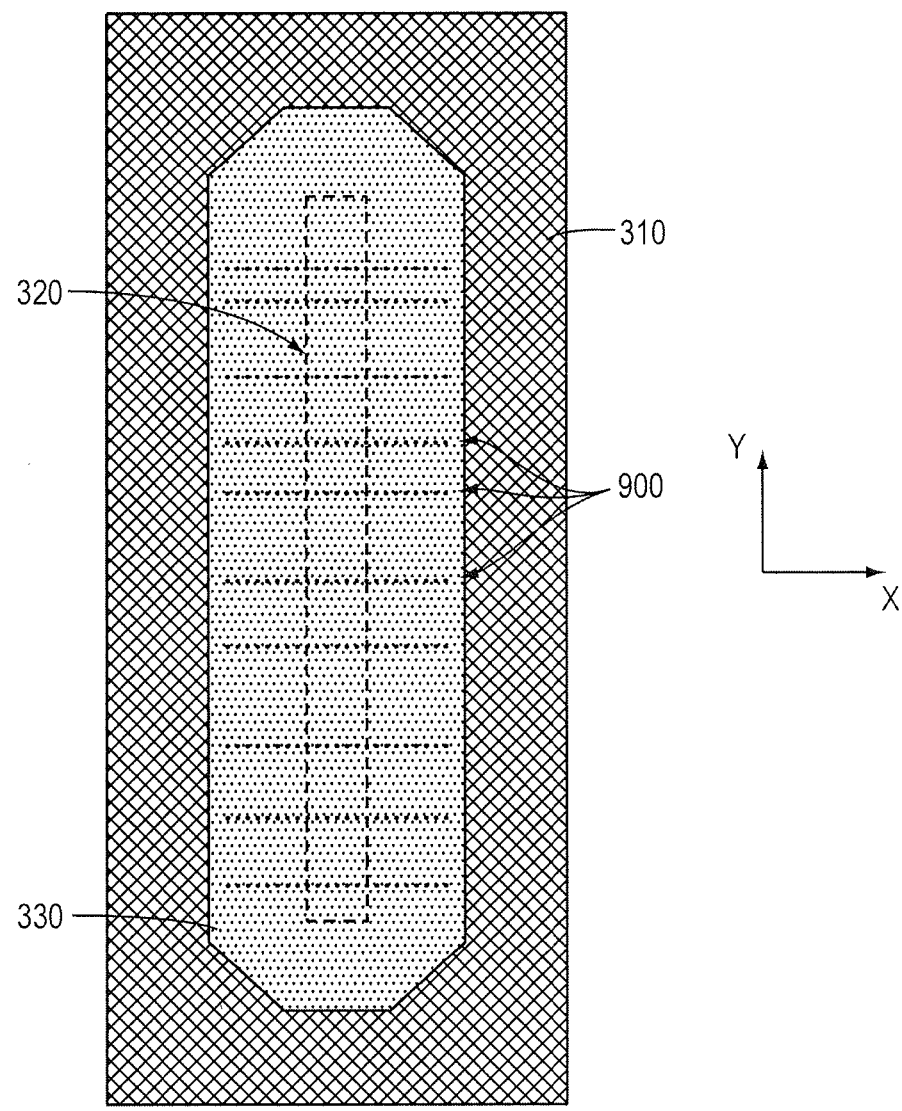
Figure 9B:
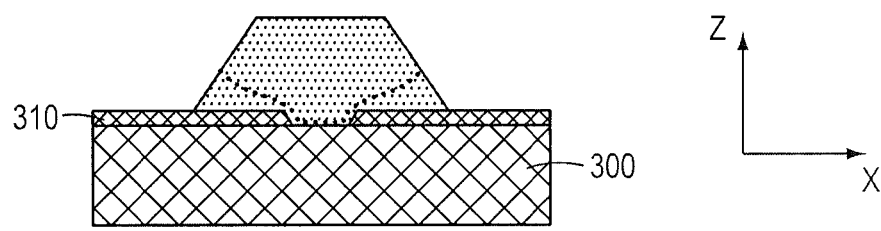
Figure 10A:
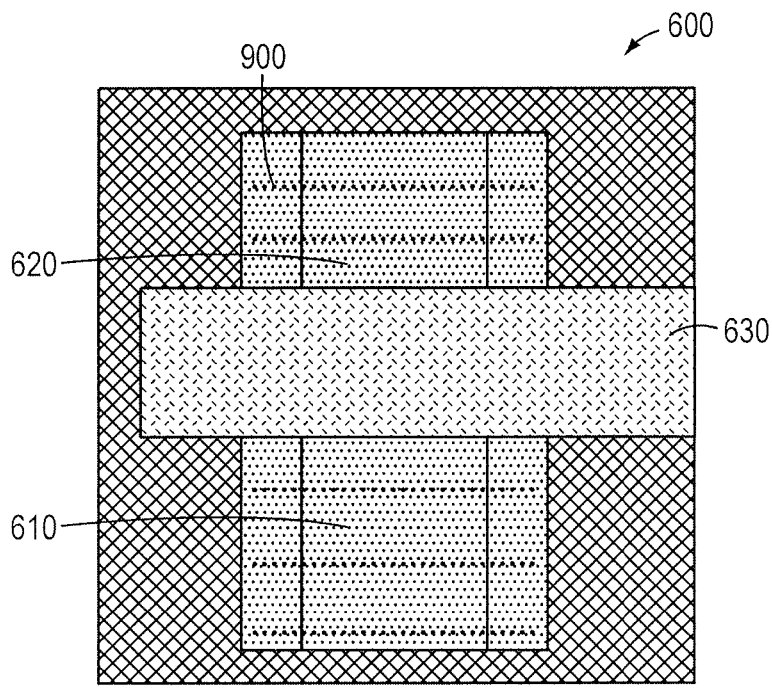
Figure 10B:
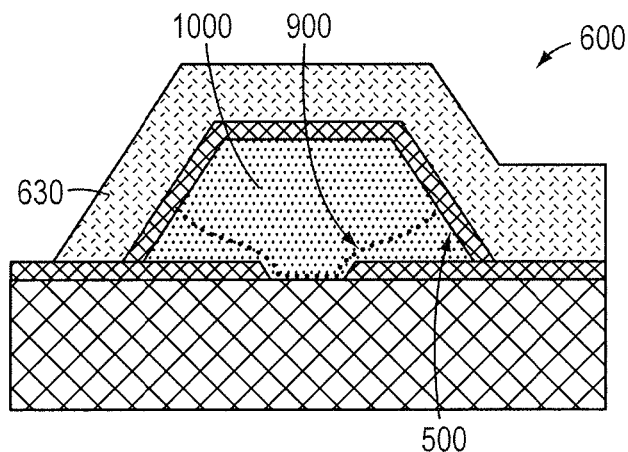
Figure 10C:
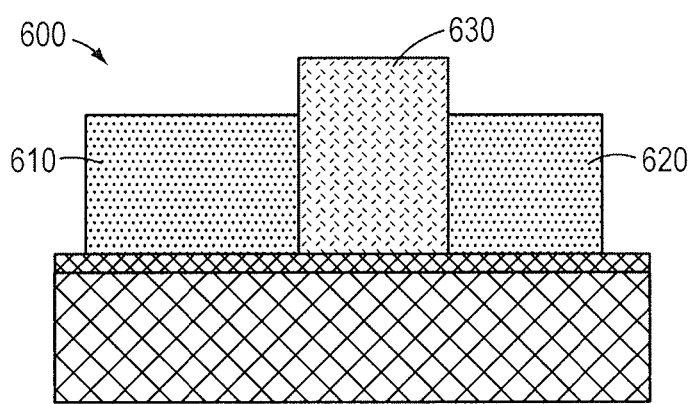

In many implementations of the technology discussed herein, both width and length of the seed window are constrained in order to achieve an omnidirectional elastic relaxation of the lattice-mismatched material, as shown in FIG. 8. In other implementations, however, long, narrow seed windows are employed to achieve elastic relaxation in one direction (x) and plastic relaxation in the other (y), as shown in FIG. 9. Plastic relaxation of the y-direction strain results in the formation of dislocations 900. This configuration is useful for semiconductor device applications, if misfits are oriented such that they cannot form shorts between junctions, e.g., perpendicular to current flow between source and drain regions of a MOSFET 600, such as a surround-gate MOSFET including a channel 1000 shown in FIG. 10.

Notably, if the thickness of the heteroepitaxial region is only a few times its critical thickness, or less, the Y-direction strain may be substantially maintained, due to kinetic barriers to dislocation nucleation, as discussed, for example, in E. A. Stach et al., Phil. Mag. A, Vol. 80, No. 9, p 2159 (2000), incorporated herein by reference. This phenomenon can be advantageous in certain situations: for example, if the substrate is Si and the lattice-mismatched semiconductor material grown thereover is SiGe or Ge, the resulting wrap-around gate FET will have uniaxial compression in the direction of current flow. Uniaxial compression can have a beneficial impact on hole mobility in SiGe or Ge MOSFETs.

B. Local Heterointegration Process without Confining Sidewalls for MOSFET Active Area As described in co-pending application Ser. Nos. 11/436, 198 and 11/436,062, both filed on May 17, 2006, and incorporated by reference herein, the "epitaxial necking" technique focuses on confining the undesirable dislocations to the lower portion of a hole or trench, away from the active-area surface. This approach offers process simplicity by utilizing a combination of selective epitaxial growth and defect crystallography to force defects to the sidewall of the opening in the patterning mask and produces limited-area regions having upper surfaces substantially exhausted of threading dislocations.

However, in certain applications, MOSFETs may be fairly tolerant of threading dislocations. For example, MOSFET devices have been produced commercially on SOI wafers with threading dislocation densities ("TDD") as high as $10^6$ cm$^{-2}$. An integration scheme described herein focuses on reducing TDD to levels that are sufficient for some MOSFET applications, particularly for the heterostructures where the amount of mismatch between the active-area material and the underlying substrate is not too significant. As discussed in J. G. Fiorenza, et al., *Film Thickness Constraints for Manufacturable Strained Silicon CMOS*, Semicond. Sci. Technol., Vol. 19, p. L4 (2004), incorporated herein by reference, however, it is important to keep misfit dislocations out of the channel area, as these are well known to be highly deleterious to MOSFET off-current even at low levels.

Figure 11A:
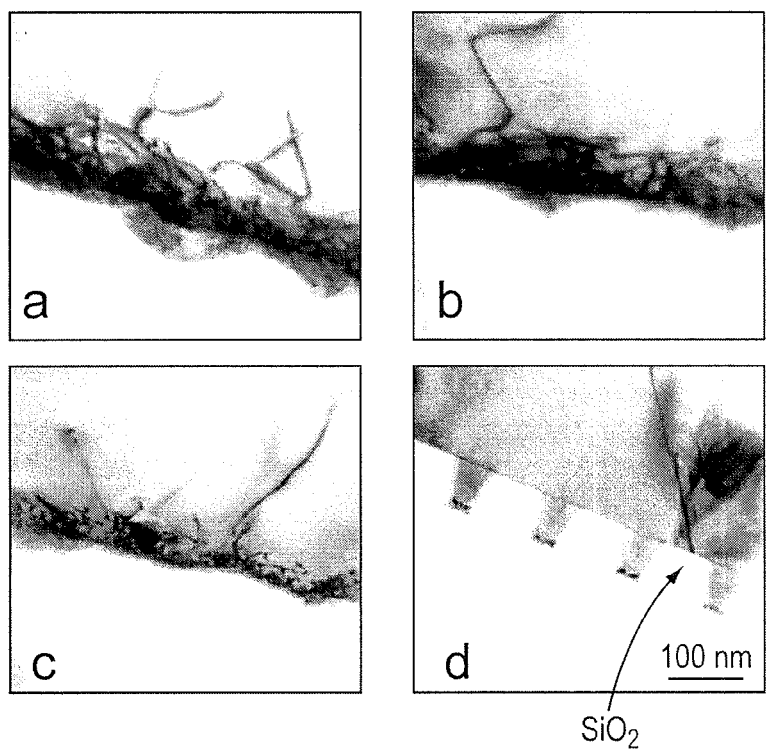
FIGS. 11A(a)-11A(d) are micrograph images illustrating the effect of reducing lateral dimensions of a heteroepitaxial region on the thickness of a heavily dislocated region between mismatched regions.
Figure 11B:
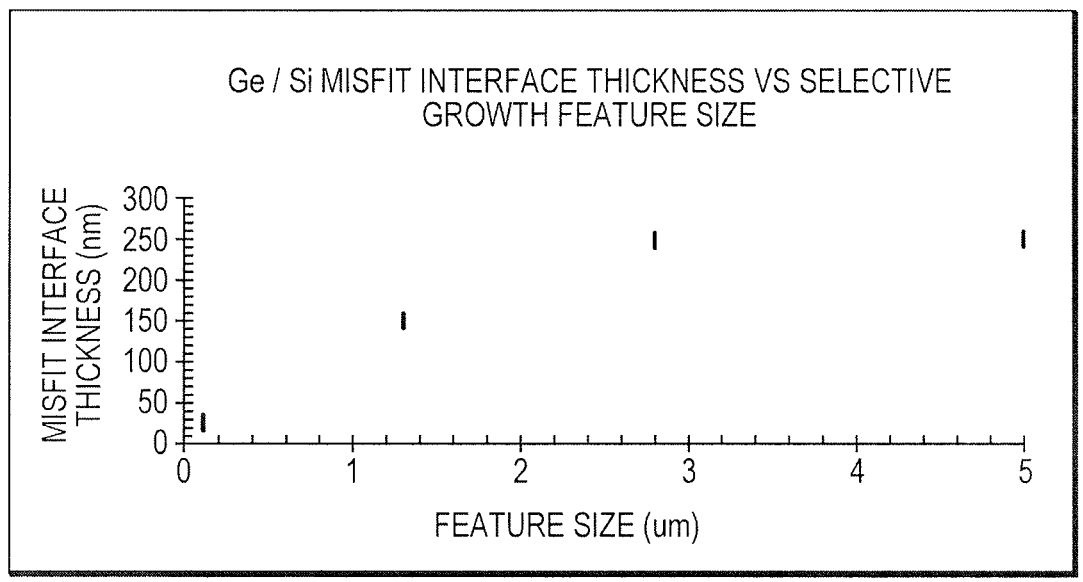
FIG. 11B is a graph depicting Ge/Si misfit dislocation interface thickness dependence on selective growth feature size.

Referring to FIG. 11A, reducing lateral dimensions of a heteroepitaxial region can dramatically reduce the vertical extent of the heavily-dislocated region that exists at the boundary between mismatched regions. This has been demonstrated with Ge epitaxy on Si substrates by Tom Langdo in a thesis entitled "Selective SiGe Nanostructures" (Ph.D. Thesis, MIT, 2001), incorporated herein by reference. Specifically, FIG. 11A depicts interface dislocation comparison showing (a) the control Ge/Si substrate interface on unpatterned Si, (b) in 2.8 µm features, (c) in 1.3 µm features, and (d) on interferometric lithography patterned substrates with 100 nm features. All images are shown at the same magnification. Note the reduction in thickness of the interfacial dislocation region as the feature dimension is reduced from (b) to (c) to (d). FIG. 11B depicts Ge/Si misfit dislocation interface thickness dependence on selective growth feature size.

Figure 12A:
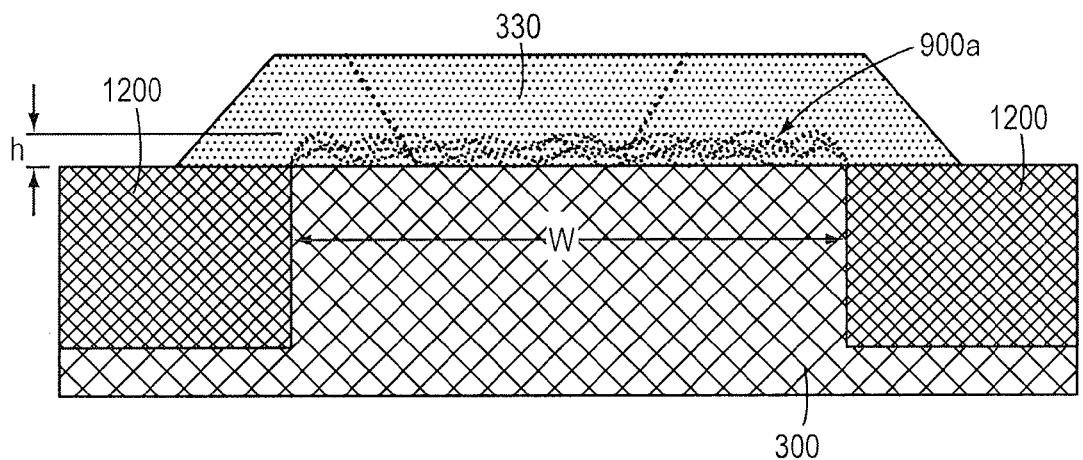
FIGS. 12A-12B are schematic cross-sectional views illustrating a method for using selective heteroepitaxy on small areas of silicon to create non-silicon active areas for MOSFETs, according to an embodiment of the invention.

Referring to FIG. 12A, selective heteroepitaxy is utilized on small areas of silicon to create non-silicon active areas for MOSFETs. In contrast to the epitaxial necking approach discussed above, insulator sidewalls bounding the epitaxial region are not necessary, simplifying process integration. In some implementations of this aspect of the technology disclosed herein, a CMOS wafer is processed through conventional STI formation steps, and then a heteroepitaxial region is selectively grown (e.g. via CVD), surrounded on all four sides by STI 1200. The thickness of the heavily dislocated region h next to the substrate generally corresponds to the data derived from the graph in FIG. 11B. In order to confine the heavily dislocated region 900*a* to a narrow area of height h next to the substrate, the distance between STI regions is preferably constrained either in the x dimension or y dimension (or both) to be less than about 1 µm. This is so that h is substantially less than it would be in the case for a blanket heteroepitaxial film. In a particular implementation, it may be desirable to constrain h to 50 nm (for example, to limit the total amount of epitaxy thickness required for the device active area). In this case, w should be approximately 400 nm, as estimated based on linear interpolation between experimental data points shown in FIG. 11B.

Figure 12B:
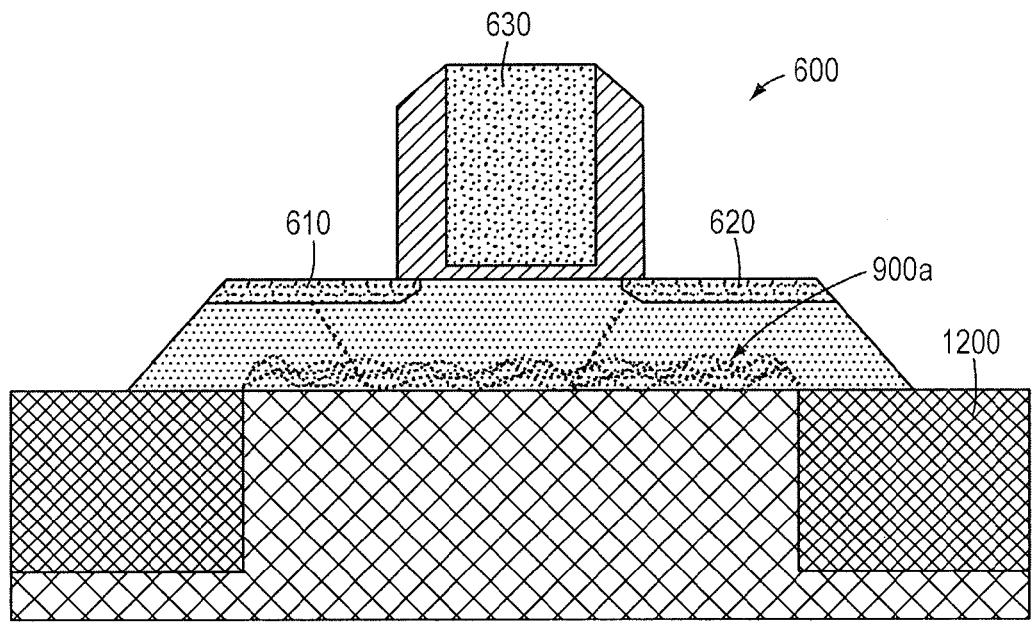

Transistor elements, including gate and source/drain regions, are then fabricated as shown in FIG. 12B, keeping any part of the source or drain regions from intersecting the heavily dislocated region. Otherwise, source and drain dopants can diffuse along the dislocations, causing serious leakage problems.

C. Large-Area Heterointegration

Figure 13A:
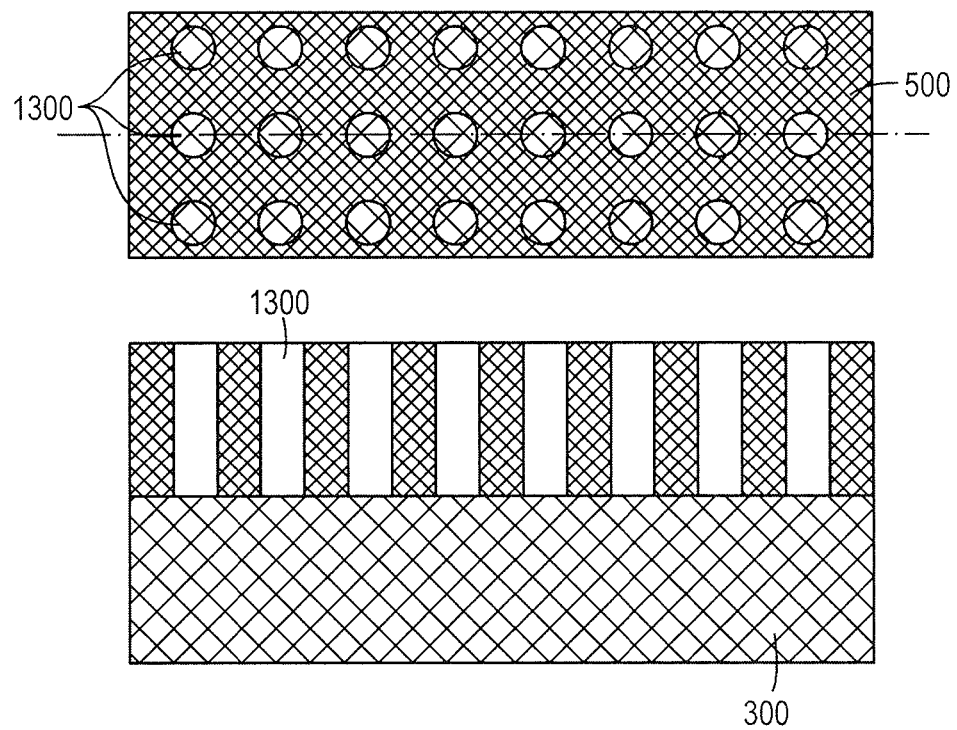
FIGS. 13A-13B, 14A-14C, and 15A-15B are schematic top and cross-sectional views illustrating semiconductor heterostructures utilizing various techniques for creating large active areas within heteroepitaxial regions, according to embodiments of the invention.
Figure 13B:
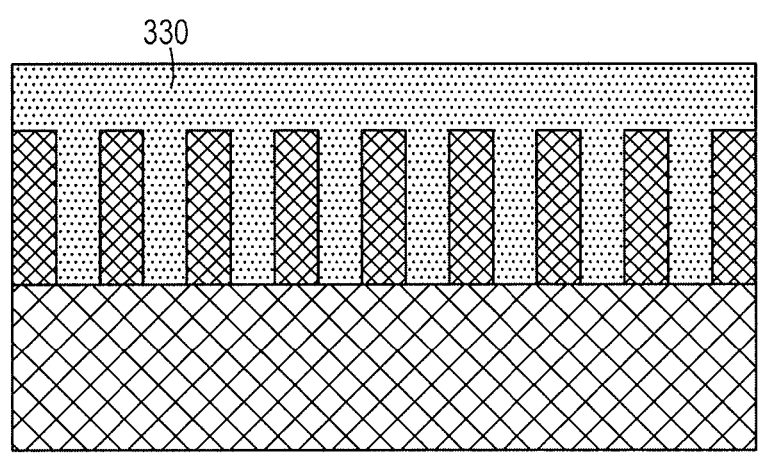

Referring to FIGS. 13A-13B, in one of its many aspects, the technology disclosed herein focuses on creating large active areas within the heteroepitaxial region by a combination of epitaxial necking and ELO techniques, employing a self-assembled mask. Specifically, an oxide layer defining an array of holes 1300 therethrough can be formed using self-assembly techniques, thereby avoiding traditional time-consuming lithography and etch approaches. For an example of how a self-assembled array of vertical holes in an insulator layer may be created on a Si substrate, see an article by Wenchong Hu et al entitled "Growth of well-aligned carbon nanotube arrays on silicon substrates using porous alumina film as a nanotemplate" and published in Applied Physics Letters, Vol. 79, No. 19 (2001), incorporated herein by reference. The article describing how anodic oxidation of the aluminum can be used to create a self-assembled array of vertical holes similar to that shown in FIG. 13A, where the insulator is alumina (Al$_2$O$_3$). The process described by Hu et al., however, leaves a small residual layer of alumina at the bottom of each hole. To remove this residual layer, an anisotropic dry etch (much higher etch rate normal to the wafer surface than parallel to the wafer surface) may be performed, exposing the silicon which is the 'seed' for subsequent epitaxial necking. Then, heteroepitaxial regions are selectively grown within out of the holes, at least until resulting islands coalesce. Depending on lateral dimensions of the aperture, degree of mismatch, and rigidity of sidewall oxide, either plastic or elastic relaxation of the heteroepitaxial "pillars" may dominate. The resulting heteroepitaxial layer is then planarized (FIG. 13B), e.g. via CMP, and the active-area, substantially exhausted of threading dislocations is used for device fabrication.

Figure 14A:
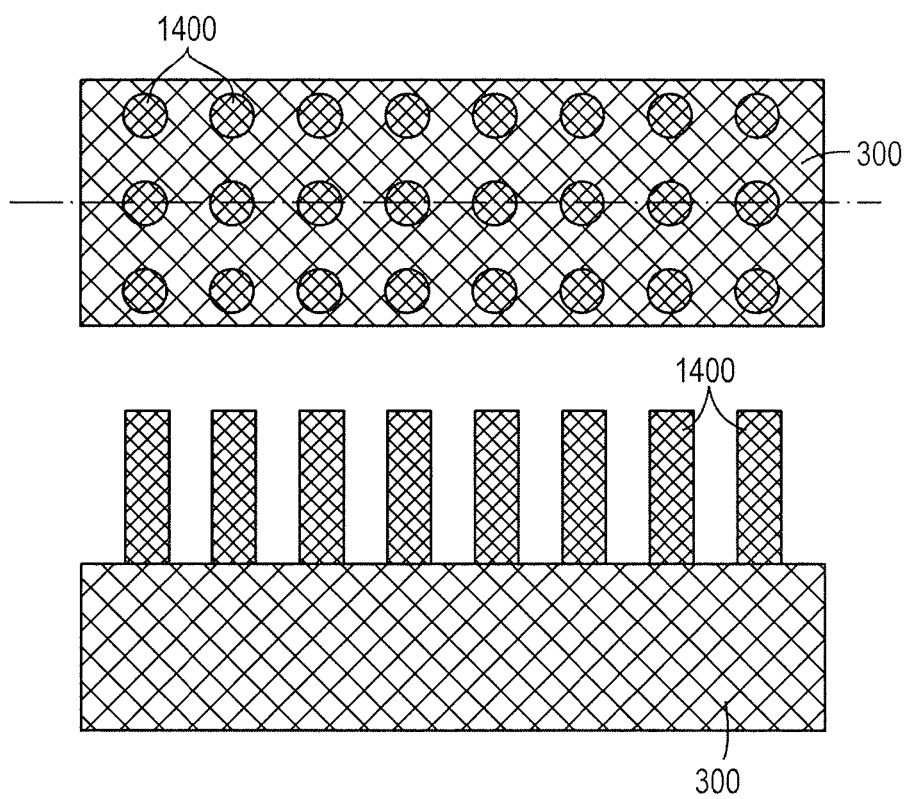
Figure 14B:
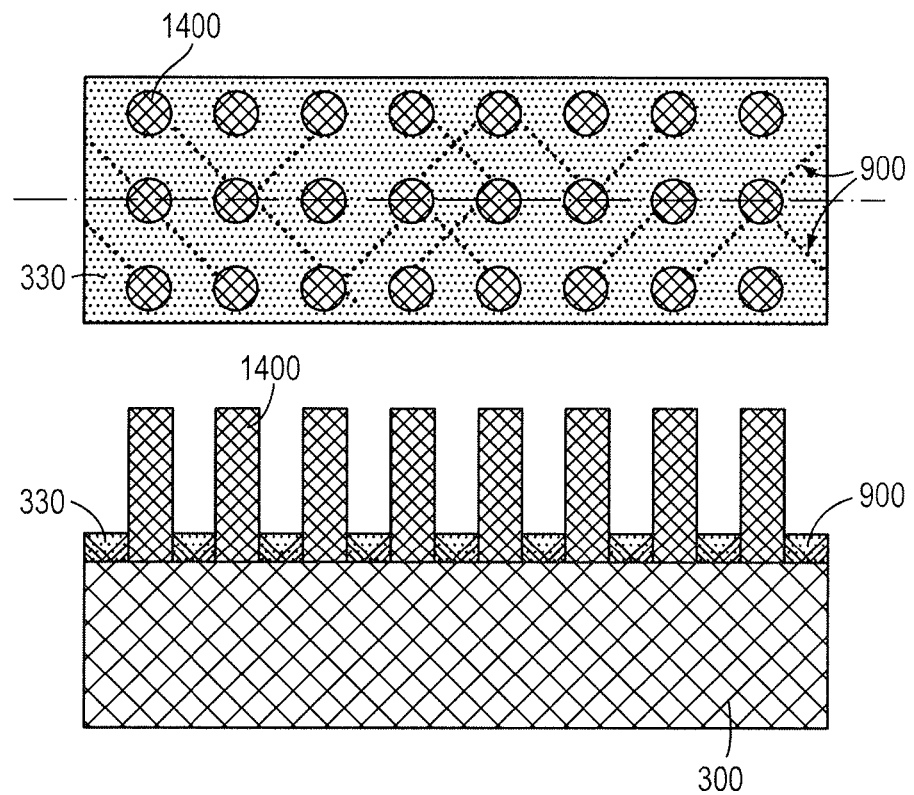
Figure 14C:
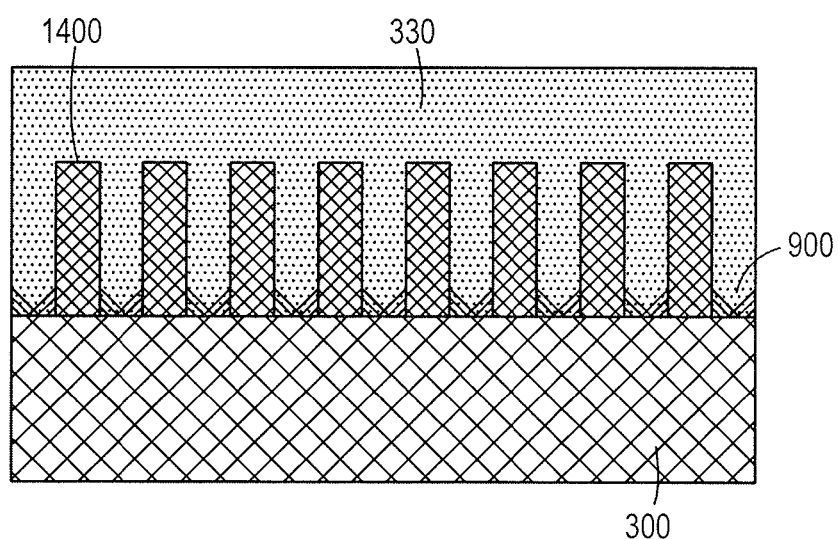

Referring to FIGS. 14A-14C, in another aspect, the technology disclosed herein focuses on creating large active areas within the heteroepitaxial region by a technique similar to epitaxial necking, employing selective epitaxial growth between disconnected mask elements. Specifically, an oxide layer defining an array of disconnected pillars 1400 formed of insulating material can be provided over the substrate using either self-assembly techniques, or conventional lithography and etch approaches (FIG. 14A). Preferably, the distance between the pillars is equal to or less than the pillar radius. Then, during selective epitaxial growth of the lattice-mismatched semiconductor material over the substrate, with onset of plastic relaxation, dislocations form and are blocked or confined at insulator pillars (FIG. 14B). Specifically, dislocations reach and terminate at the surfaces of the pillars at or below a predetermined distance from the surface of the substrate, such that threading dislocations in the heteroepitaxial region decrease in density with increasing distance from the surface of the substrate. Accordingly, the upper surface of the heteroepitaxial region is substantially exhausted of threading dislocations, enabling formation of semiconductor devices having increased channel width.

Blocking of the dislocation is promoted by geometry of the pillar array and because of the forces that cause dislocations to exit at the sidewalls of the pillars. Specifically, even when dislocations have an orientation that does not favor trapping at sidewalls, epitaxial necking approach is still effective at certain dimensions because of the forces that draw dislocations to free surfaces in order to reduce the elastic energy of the crystal. Mathematically, they arise because the boundary conditions of the expressions for strain require strain components to be zero at surfaces. As discussed by Tom Langdo in the 2001 thesis referenced above, for the case of Ge grown selectively in holes in a $SiO_2$ mask on Si substrates, it was observed that "all defects within ~300 nm of the window edge are bent and forced out to the $SiO_2$ sidewall." The epitaxial growth continues between the pillars until continuous layer is achieved, followed by planarization of the resulting structure (see FIG. 14C).

Notably, in contrast to epitaxial necking approaches using seed windows, the entire volume of the lattice-mismatched material is epitaxially grown over the substrate between the pillars. As a result, one of the features of this approach is avoiding the situation wherein regions of the lattice-mismatched material plastically relax in isolation from neighboring regions, resulting in formation of interface defects when the adjacent regions coalesce.

Figure 15A:
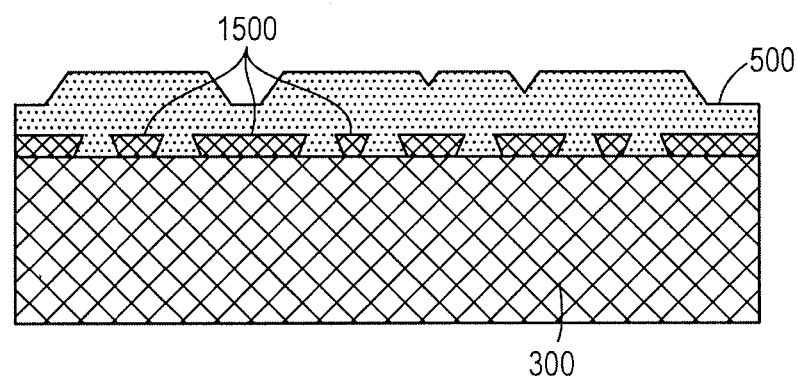
Figure 15B:
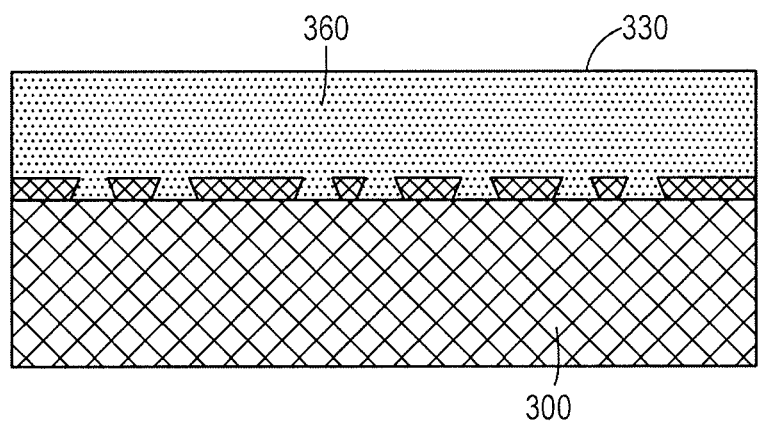

In still another aspect, the present technology relates to creating large active areas within the heteroepitaxial region by maskless ELO technique, based on elastic relaxation. Referring to FIGS. 15A-15B, a plurality of small islands 1500 of lattice-mismatched semiconductor material is nucleated over the substrate without photolithography or masking. Each of the islands is small enough to avoid plastic relaxation and corresponding misfit nucleation. These will serve as "seeds" for subsequent epitaxy. As skilled artisans will readily recognize, nucleation of disconnected islands is a typical result of highly-mismatched heteroepitaxy on blanket substrates. The growth conditions which result in such 'islanding' are commonly understood and widely published within the heteroepitaxy research community. Then, an insulator layer is deposited over the substrate and the seed islands disposed thereover, for example, via CVD, followed by planarization of the insulator layer to expose top surfaces of the seeds. The lattice-mismatched semiconductor material is then grown over the seeds and the insulator layer by selective epitaxy, again followed by planarization of the resulting heteroepitaxial region.

D. Electrical Isolation of Defective Area of Heteroepitaxial Region from Non-Defective Areas It is well known that dislocations forming due to the relaxation of mismatch strain in heteroepitaxial systems can be deleterious to device performance. In general, keeping the charge carriers, holes or electrons or both, away from the defects avoids such deleterious effects. While the epitaxial necking approach discussed above confines such defects to the bottom part of the heteroepitaxial region within a hole or trench, it is desirable to confine carriers of one or both types to the substantially defect-free region in the upper part of the heteroepitaxial region. For MOSFET applications, the electric field applied to the gate of a MOSFET may be sufficient to confine carriers away from the defective regions. However, for some other applications (e.g. LEDs or photodiodes) some other approaches are needed. In particular, such confinement in the context of epitaxial necking can be implemented by forming either homo- or heterojunctions in the heteroepitaxial region within the "necking" aperture.

Figure 16A:
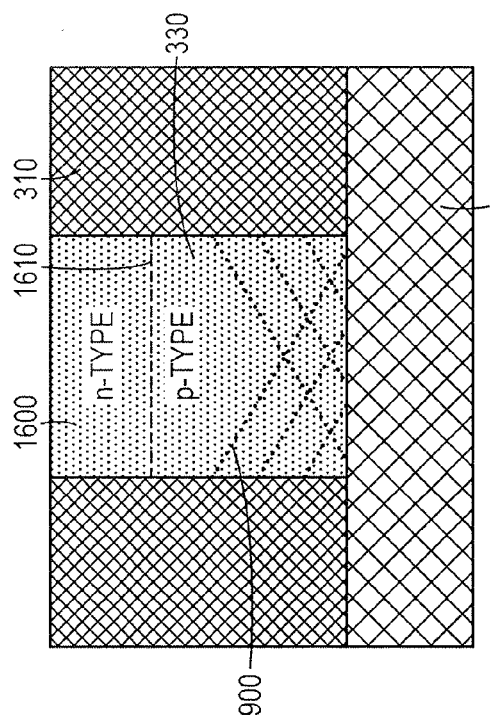
FIGS. 16A-16B, and 17A-17B are schematic cross-sectional views illustrating semiconductor heterostructures utilizing homojunctions or type I or II heterojunctions within a heteroepitaxial region to confine electrons and/or holes to a non-defective region thereof, according to embodiments of the invention.
Figure 16B:
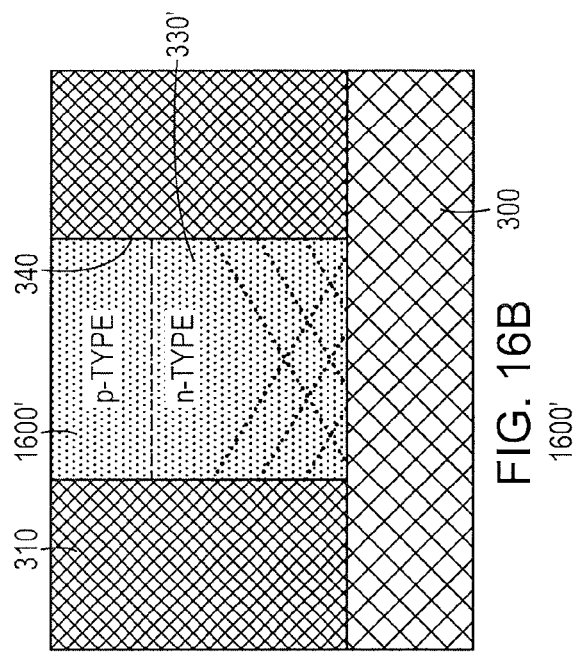

Referring to FIGS. 16A-16B, in some embodiments, n- or p-type dopants are implanted within the heteroepitaxial region and/or grown in-situ, such that a homojunction is formed within the lattice-mismatched material in the aperture, confining either electrons (FIG. 16A) or holes (FIG. 16B) to the non-defective region. In particular, a structure may include a substrate including a first crystalline material, e.g., Si, and having a top substrate surface. A non-crystalline mask layer 310 is disposed above the substrate 300. The non-crystalline mask layer may include a dielectric material, such as $SiO_2$. The non-crystalline mask layer has a top surface and an opening defined by sidewalls 340 extending from the top surface of the non-crystalline mask layer to the top surface of the substrate. A cross-section of the opening may be one of various shapes, including substantially circular, substantially square, or substantially rectangular. The opening may be configured as an elongated trench. The sidewalls of the opening may be substantially perpendicular to a top substrate surface.

A second crystalline material 330 is disposed in the opening, and is lattice mismatched to the first crystalline material. A thickness of the second crystalline material is sufficient to permit a majority of defects arising from the lattice mismatch to exit the second crystalline material at the sidewalls. A third crystalline material 1600 is disposed above the second crystalline material and defines a junction 1610 between the second crystalline material and the third crystalline material. The junction is configured to confine selected charge carriers, i.e., holes or electrons, to one side of the junction. The second crystalline material 330 may be p-type and the third crystalline material 1600 may be n-type (FIG. 16A) or the second crystalline material 330' may be n-type and the third crystalline material 1600' may be p-type (FIG. 16B). The second and third crystalline materials may be substantially lattice matched. The substrate may include a group IV element or compound, such as Si, and the second and third crystalline materials may each include at least one III-V semiconductor compound. A top surface of the third crystalline material may be substantially coplanar with the top surface of the mask layer. This may be achieved by, e.g., planarizing the top surface of the mask layer and the top surface of the third crystalline material by, for example, chemical-mechanical polishing.

In some embodiments, the second crystalline material includes a first semiconductor material having a first doping type and a first doping level, the third crystalline material includes a second semiconductor material having a second doping type and a second doping level. The first and second doping types are the same, e.g., both n-type or p-type, and the first and second doping levels are different, e.g. $\sim 5 \times 10^{16}/cm^3$ and $\sim 5 \times 10^{18}/cm^3$ respectively. Alternatively, the first doping type and second doping type may be different, e.g., the first doping type n-type (with a first doping level e.g. in the range $1 \times 10^{16}/cm^3$ to $1 \times 10^{20}/cm^3$) and the second doping type p-type (with a second doping level e.g. in the range $1 \times 10^{16}/cm^3$ to $1 \times 10^{20}/cm^3$), or vice versa.

Figure 17A:
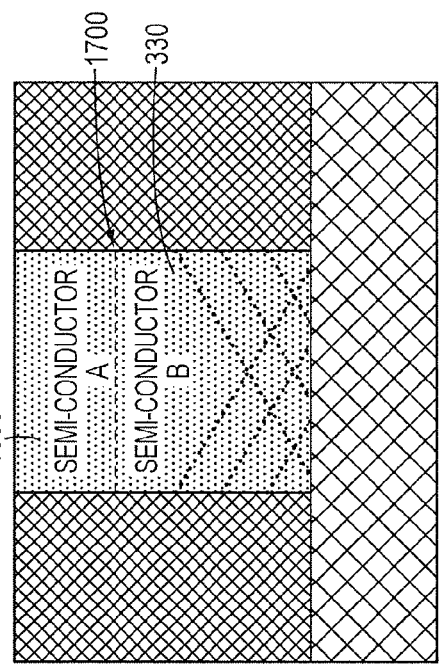
Figure 17B:
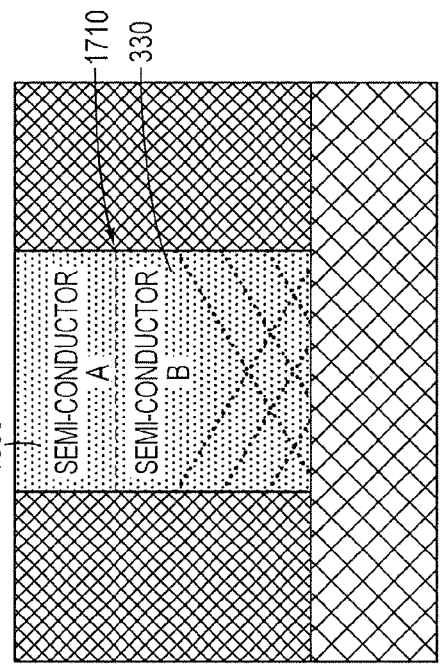

Alternatively, referring to FIGS. 17A-17B, in other embodiments, either a type II 1700 or type I 1710 heterojunction may be formed in or above the opening by depositing a different semiconductor material (third crystalline material 1600) over the lattice-mismatched material containing the defective area (second crystalline material 330), thereby confining either electrons or holes (FIG. 17A) or electrons and holes (FIG. 17B) to the non-defective region. For type I heterojunctions, for electron and hole confinement to non-defective regions, a key is for $Eg_A<Eg_B$, where Eg is energy band-gap, and the subscripts refer to the semiconductor region labels in FIG. 17B. An example of this is be growing $Al_{0.5}Ga_{0.5}As$ in semiconductor region B (second crystalline material 330) of FIG. 17B and GaAs in semiconductor region A (third crystalline material 1600) of FIG. 17B. For type II heterojunctions, for electron confinement to non-defective regions, a key is for $\lambda_A>\lambda_B$, where λ is electron affinity and the subscripts refer to the semiconductor region labels in FIG. 17A. For hole confinement to non-defective regions, a key is for $(\lambda_A+Eg_A)<(\lambda_B+Eg_B)$, and again the subscripts refer to the semiconductor region labels in FIG. 17A. In these embodiments, the second crystalline material 330 includes a first semiconductor material, the third crystalline material 1600 includes a second semiconductor material, and the first and second semiconductor materials are different. To avoid propagation of new mismatch dislocations into the third crystalline material 1600 due to plastic relaxation of the third crystalline material, the second and third crystalline materials are substantially lattice-matched, i.e., the lattice constants between the first and second crystalline materials are preferably similar, e.g., within 1%. Each of the second and third crystalline materials 330 and 1600 may include, or consist essentially of, a group II, a group III, a group IV, a group V, and/or a group VI element, and/or combinations thereof, for example, germanium, silicon germanium, gallium arsenide, or gallium nitride.

In any of the embodiments illustrated in FIGS. 16A-16B and 17A-17B, a device may be at least partially disposed over the third crystalline material. An active area of the device may include at least a portion of the third crystalline material. The device may be, e.g., a MOSFET, a photo-sensitive device, a light emitting device, or a photovoltaic device.

E. Control of Surface Characteristics of Heteroepitaxial Regions

Various device applications require very high minority carrier lifetime, and/or dominance of one kind of recombination mechanism (referring to the mechanism by which holes and electrons recombine) over others (e.g. radiative recombination dominating over non-radiative recombination, for light emitting devices). In these applications, it is typically desirable to keep carriers away from semiconductor surfaces, where carrier recombination rates are typically high, and the recombination mechanism is typically non-radiative. In other situations, even though carrier lifetime is less important, it is still desirable to keep current flow away from a free surface, such as edges of mesa- or STI-isolated FETs, to suppress edge-leakage effects. The following technique can be employed to address this objective in the context of epitaxial necking.

Figure 18A:
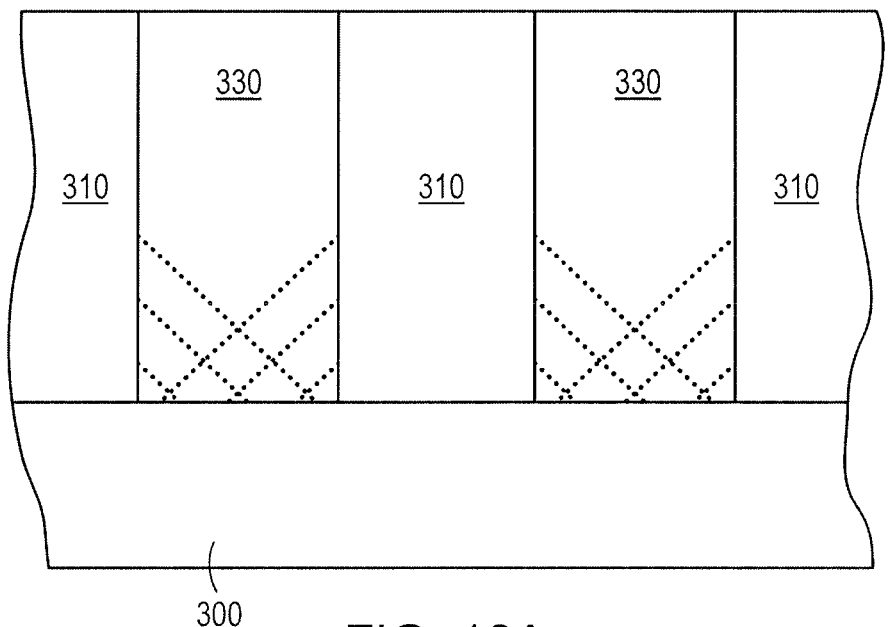
FIGS. 18A-18E are schematic cross-sectional views of semiconductor heterostructures illustrating techniques for keeping carriers or current flow away from semiconductor surfaces, according to embodiments of the invention.
Figure 18B:
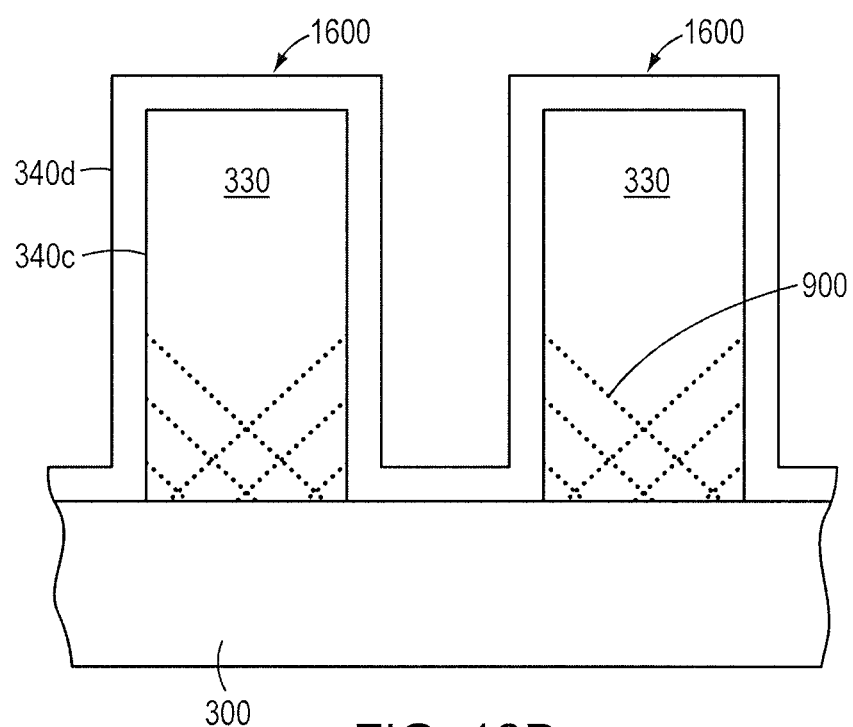

Referring to FIGS. 18A-18D, a substrate 300 is provided that includes, or consists essentially of, a first crystalline semiconductor material, such as, for example, silicon. A mask 310 is disposed over the substrate and has one or more openings or "seed windows," extending to the surface of the substrate. The mask may include a dielectric material, such as, for example, silicon dioxide or silicon nitride. A second crystalline semiconductor material 330, lattice-mismatched to the underlying substrate, is deposited in the opening over the substrate, forming a heteroepitaxial region. The heteroepitaxial region is planarized to remove a portion of the second crystalline semiconductor material extending above the surface of the mask (FIG. 18A). The mask is then removed and a third crystalline semiconductor material 1600 is grown over the second crystalline semiconductor 330. Thus, the second crystalline semiconductor material is disposed on the substrate in a predetermined configuration defining a top surface and a lateral sidewall surface 340c extending from a top surface of the substrate to the top surface defined by the predetermined configuration, the lateral sidewall surface having a height above the top surface of the substrate sufficient to permit a majority of defects arising from the lattice mismatch to exit the second material at the lateral sidewall surface. The lateral sidewall surface may define a column having a generally circular cross-section or a generally square cross-section. The lateral sidewall surface may define an elongated cross-section parallel to the top surface of the substrate, the elongated cross-section having a length and a width, the length being more than twice the width.

The third crystalline material 1600 is disposed on at least a portion of the sidewall surface of the second material to define an outer sidewall surface 340d. In some embodiments, the third crystalline semiconductor material is disposed over substantially the entire lateral sidewall surface. The third crystalline semiconductor material may be disposed over the top surface of the second material to define an outer top surface. The third crystalline semiconductor material may be disposed over the substrate adjacent to the second crystalline semiconductor material.

The third crystalline semiconductor material may be substantially lattice matched with the second crystalline material and/or may form a heterojunction with the second crystalline semiconductor material. The third crystalline semiconductor material may have a wider bandgap than a bandgap of the second crystalline semiconductor material. This will keep holes and electrons confined to the second crystalline semiconductor material, and thus away from any semiconductor surface (where 'surface' in this context means a boundary between a semiconductor and free space or between a semiconductor and a non-semiconductor material; a boundary between two semiconductor regions is not considered a 'surface' in this context). Thus, the addition of the third crystalline semiconductor material leads to lower carrier recombination rates and especially to lower non-radiative recombination rates. In an alternate embodiment, the third crystalline semiconductor material may have a different doping type than the second crystalline semiconductor material, e.g., p-type versus n-type, or vice versa. This will make it unlikely that both carrier types are present at the surface of the third crystalline semiconductor material even though one or the other carrier type may be commonplace at the surface. For example, if the second crystalline semiconductor material is n-type and the third crystalline semiconductor material is p-type, the carriers present at the third crystalline semiconductor material surface will be predominantly holes. Since a high carrier recombination rate may require significant presence of both holes and electrons, this configuration may prevent significant carrier recombination at a semiconductor surface.

The second crystalline semiconductor material may define a plurality of predetermined shapes, each shape having a top surface and a lateral sidewall surface extending from the substrate to the top surface, the sidewall surface having a height above the substrate sufficient to permit a majority of defects arising from the lattice mismatch to exit the second crystalline semiconductor material at the sidewall surface. The third crystalline semiconductor material may include a contiguous layer disposed on and in contact with the second crystalline semiconductor material.

Figure 18C:
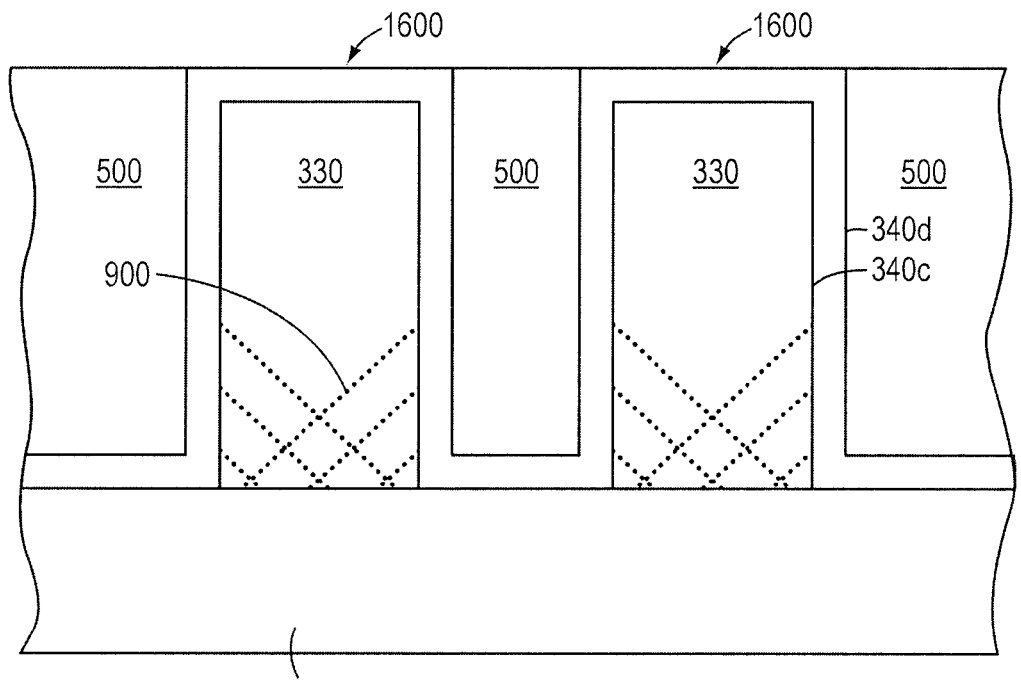
Figure 18D:
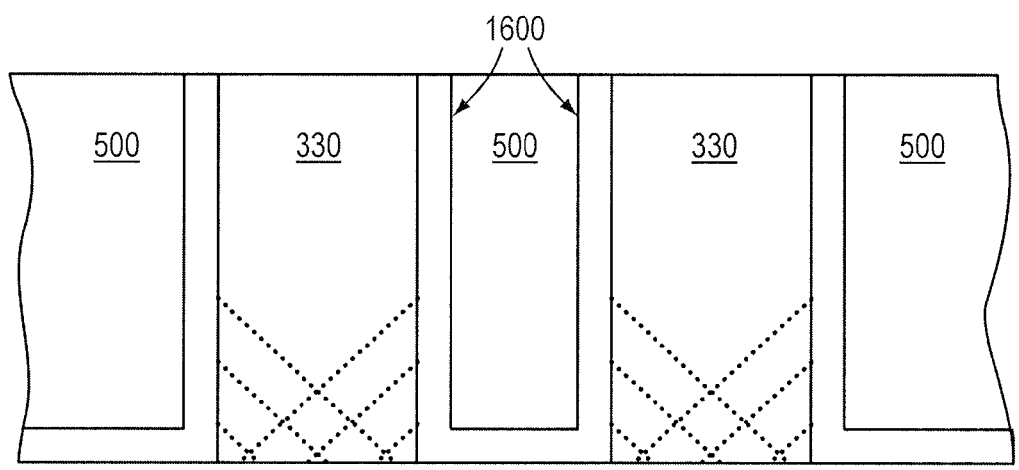

Depending on the desired application of this structure, the area between heteroepitaxial regions can then be filled with an insulator, and the resulting structure is then planarized, exposing the tops of either the second crystalline semiconductor material 330 (FIG. 18D) or the third crystalline semiconductor material (FIG. 18C). The insulating material may be disposed adjacent to and in contact with at least a portion of the lateral sidewall surface and/or adjacent to and in contact with the outer sidewall surface. The insulating material may have a height above the substrate greater than the height sufficient to permit a majority of defects arising from the lattice mismatch between the substrate and the second crystalline semiconductor material to exit the second crystalline semiconductor material at the lateral sidewall surface. The insulating material and the second and third crystalline semiconductor materials may each define a respective planar top surface that are substantially coplanar.

Figure 18E:
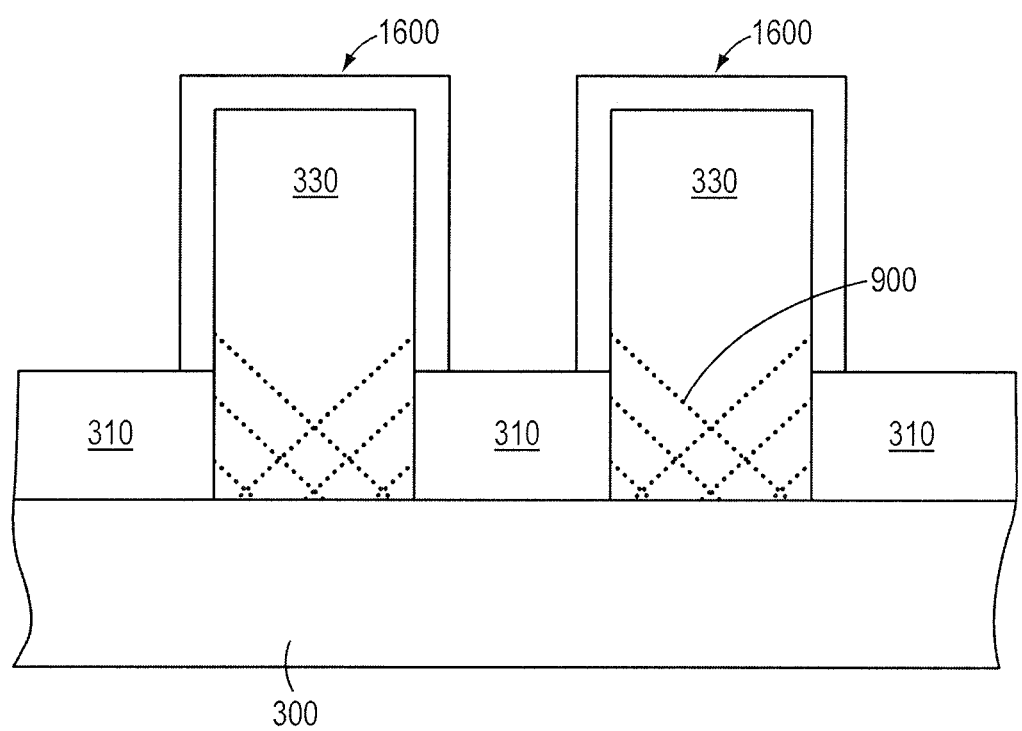

Referring to FIG. 18E, in some versions, in order to keep adjacent semiconductor regions electrically isolated, the mask can be removed only partially, e.g., via a timed dry etch, and then the wider-bandgap material B is grown over the semiconductor material A.

F. Photonic Devices on Si

Figure 19A:
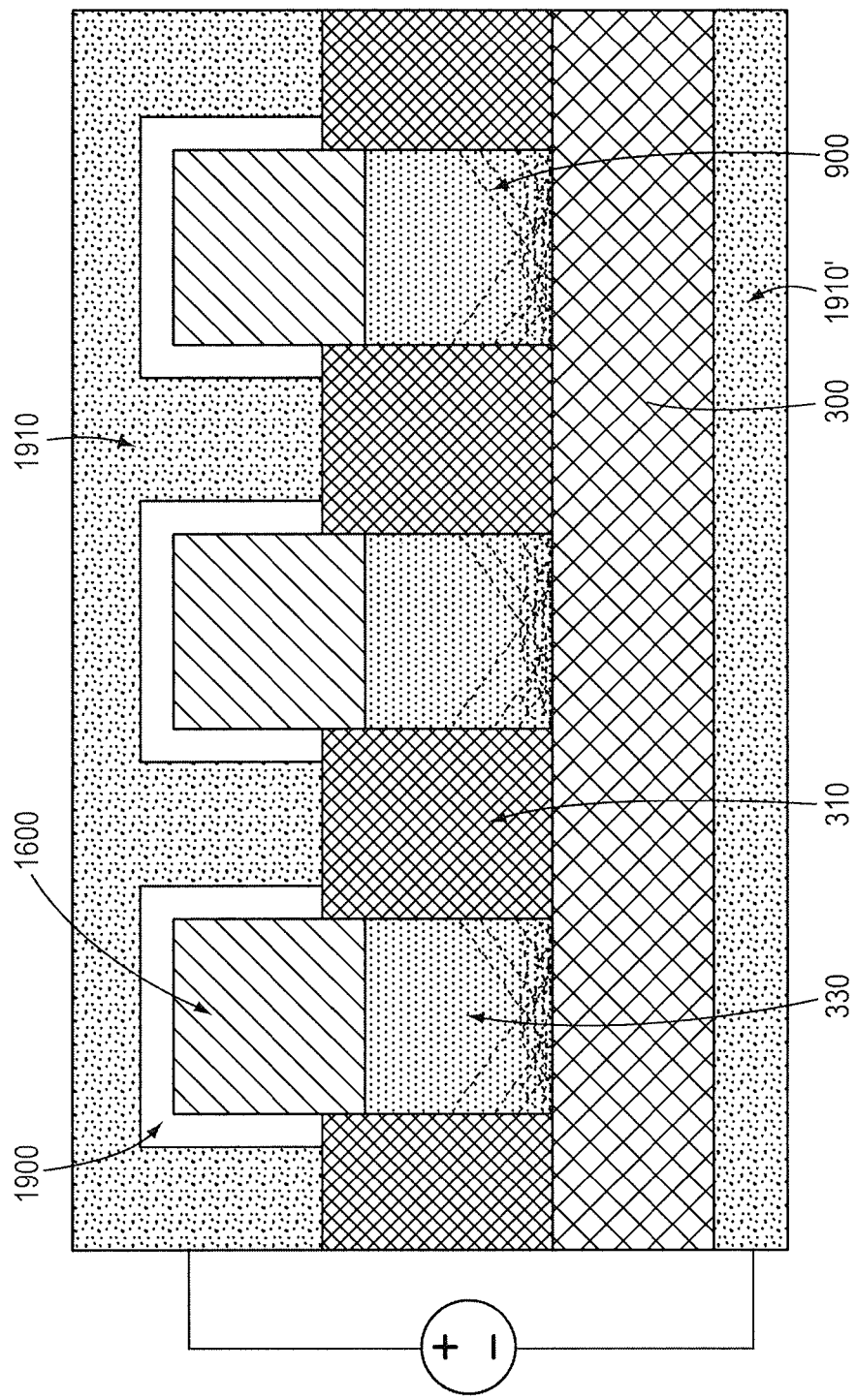
FIGS. 19A-19B are schematic views of photonic devices formed by the integration of non-Si semiconductors on Si wafers, according to embodiments of the invention.

Various implementations of the present technology described above with reference to FIGS. 16-18 make possible efficient fabrication of light emitting or photovoltaic devices (these are examples of photo-emissive and photo-absorptive devices, which are referred to herein collectively as "photonic devices") that include non-Si semiconductors, such as GaAs or InP or GaN, integrated on Si wafers, as shown in FIG. 19A. It is well known that various III-V semiconductor materials are typically far superior to Si in photonic efficiency, and the ability to integrate these materials onto a Si platform is extremely desirable. One of the key requirements of making efficient photonic semiconductor devices is to have, within the device, a semiconductor region or regions of high crystal quality for either (a) photon absorption (e.g. for photovoltaic devices) or (b) photon emission (for LEDs and lasers). Substantially avoiding semiconductor crystal dislocations in such regions is important to photonic device efficiency. This is because dislocations may promote non-radiative recombination, if both carrier types (holes and electrons) are present in the vicinity of the dislocations. Non-radiative recombination of carriers typically reduces the efficiency of either light absorbing or light emitting photonic devices. In addition, dislocation defects in the emission or absorption region of a photonic semiconductor device may lead to premature device failure. Through the use of techniques and structures described with respect to FIGS. 16-18, this goal of a high crystal quality region, substantially free of dislocation defects, for photon emission or absorption can be achieved. In particular, a structure may include a substrate including a first crystalline material, e.g., Si, and having a top substrate surface. A non-crystalline mask layer is disposed above the substrate. The non-crystalline mask layer may include a dielectric material, such as $SiO_2$. The non-crystalline mask layer has a top surface and an opening defined by sidewalls extending from the top surface of the non-crystalline mask layer to the top surface of the substrate. A cross-section of the opening may be one of various shapes, including substantially circular, substantially square, or substantially rectangular. The opening may be configured as an elongated trench. The sidewalls of the opening may be substantially perpendicular to a top substrate surface.

A second crystalline material is disposed in the opening, and is lattice mismatched to the first crystalline material. A thickness of the second crystalline material is sufficient to permit a majority of defects arising from the lattice mismatch to exit the second crystalline material at the sidewalls. A third crystalline material is disposed above the second crystalline material and defines a junction between the second crystalline material and the third crystalline material. The second and third crystalline materials may be substantially lattice matched. A top surface of the third crystalline material may be substantially coplanar with the top surface of the mask layer. This may be achieved by, e.g., planarizing the top surface of the mask layer and the top surface of the third crystalline material by, for example, chemical-mechanical polishing. The structure may, for example, include a plurality of openings. The third crystalline material disposed within an opening may be discontinuous, i.e., non-contiguous, with the third crystalline material disposed in other openings. Subsequent to growth of the third crystalline region, at least a portion of the non-crystalline mask layer may be removed, exposing at least portion of the sidewalls of the third crystalline material. A fourth crystalline material 1900 is then grown on at least a portion of the exposed surface. This fourth crystalline material may or may not be substantially lattice matched to the third crystalline material. For the case where the third and fourth crystalline materials are lattice mismatched, a thickness of the fourth crystalline material may be below the critical thickness for dislocation formation, to maintain a high quality of the interface between the third and fourth crystalline materials. The substrate may include a group IV element or compound, such as Si, and the second, third and fourth crystalline materials may each include at least one III-V semiconductor compound. A plurality of semiconductor device elements may be associated with the plurality of openings. Means for forming the semiconductor device elements are widely known to those well versed in the art. The device elements may include, for example, a photoelectric device element, a photo-emissive device element, and/or a photovoltaic device element.

The following description of doping levels and energy band gap applies specifically to a light-emitting diode (LED). At least a portion of the first and second crystalline materials may be relatively highly doped, e.g. with concentration of n-type dopants $>1\times10^{18}/cm^3$, to allow the region to serve as a relatively low resistance current path for the LED to be fabricated. The third crystalline material may be doped at a relatively low concentration and of the opposite type to the second crystalline material, e.g. with a concentration of p-type dopants $<1\times10^{17}/cm^3$. Because of the high n-type doping in the second crystalline region, the dominant carrier type in the second crystalline region will be electrons; very few holes will be present in this region. The lower value of the doping chosen for the third crystalline region allows a significant number of both electrons and holes to be present in the third crystalline region, under conditions of positive bias (i.e., when a positive voltage is applied across the completed structure, as indicated in FIG. 19A). Because of this, most of the electron-hole radiative recombination, and hence light emission, will occur in this third crystalline region. Since the third crystalline region is an area of good crystal quality, substantially free of dislocations, the electron-hole recombination therein may be substantially radiative. Promoting radiative recombination instead of non-radiative recombination is a key to high LED efficiency. The fourth crystalline material may be relatively highly doped, e.g. with concentration of p-type dopants $>1\times10^{18}/cm^3$, to allow the region to serve as a relatively low resistance current path for the LED. Optionally, an energy gap of the fourth crystalline material may be greater than that of the third crystalline material, to promote confinement of carriers to the third crystalline material and to reduce surface-related non-radiative carrier recombination, as discussed above.

A conductor layer 1910 including a first conductive material may be disposed in contact with the fourth crystalline region, overlaying the heteroepitaxial regions. This conductor layer may be transparent, translucent, or opaque. For example, the first conductive material may be indium-tin-oxide (ITO). A second conductive material 1910' may also be disposed on the back surface of the wafer. For example, this material could be aluminum. Means for depositing these conductive materials are widely known to those well versed in the art.

For the LED example described above, the first crystalline region could comprise Si, with arsenic as the dopant species. The second crystalline region could comprise GaAs or AlGaAs, with Si as the dopant species. The third crystalline region could comprise GaAs, with zinc as the dopant species. The fourth crystalline region could comprise GaAs or AlGaAs, with zinc as the dopant species.

More advanced and efficient LED structures may also be made using this approach, with a key difference being the presence of extra layers not described herein, such as undoped semiconductor quantum well emission regions surrounded by undoped semiconductor confinement regions, all disposed between the p and n regions of the LED.

For the above examples of doping types, given with respect to an LED device, the types may be reversed. That is, at least a portion of the first and second crystalline materials may be highly doped, e.g., with concentration of p-type dopants $>1\times10^{18}/cm^3$. The third crystalline material may be doped at a relatively low concentration and of the opposite type to the second crystalline material, e.g., with a concentration of n-type dopants $<1\times10^{17}$ cm$^3$. The fourth crystalline material may be highly doped, e.g., with concentration of p-type dopants$>1\times10^{18}$ cm$^3$. The resulting device would also be a functional LED, but with the voltage biasing reversed compared to the situation depicted in FIG. 19A.

Figure 19B:
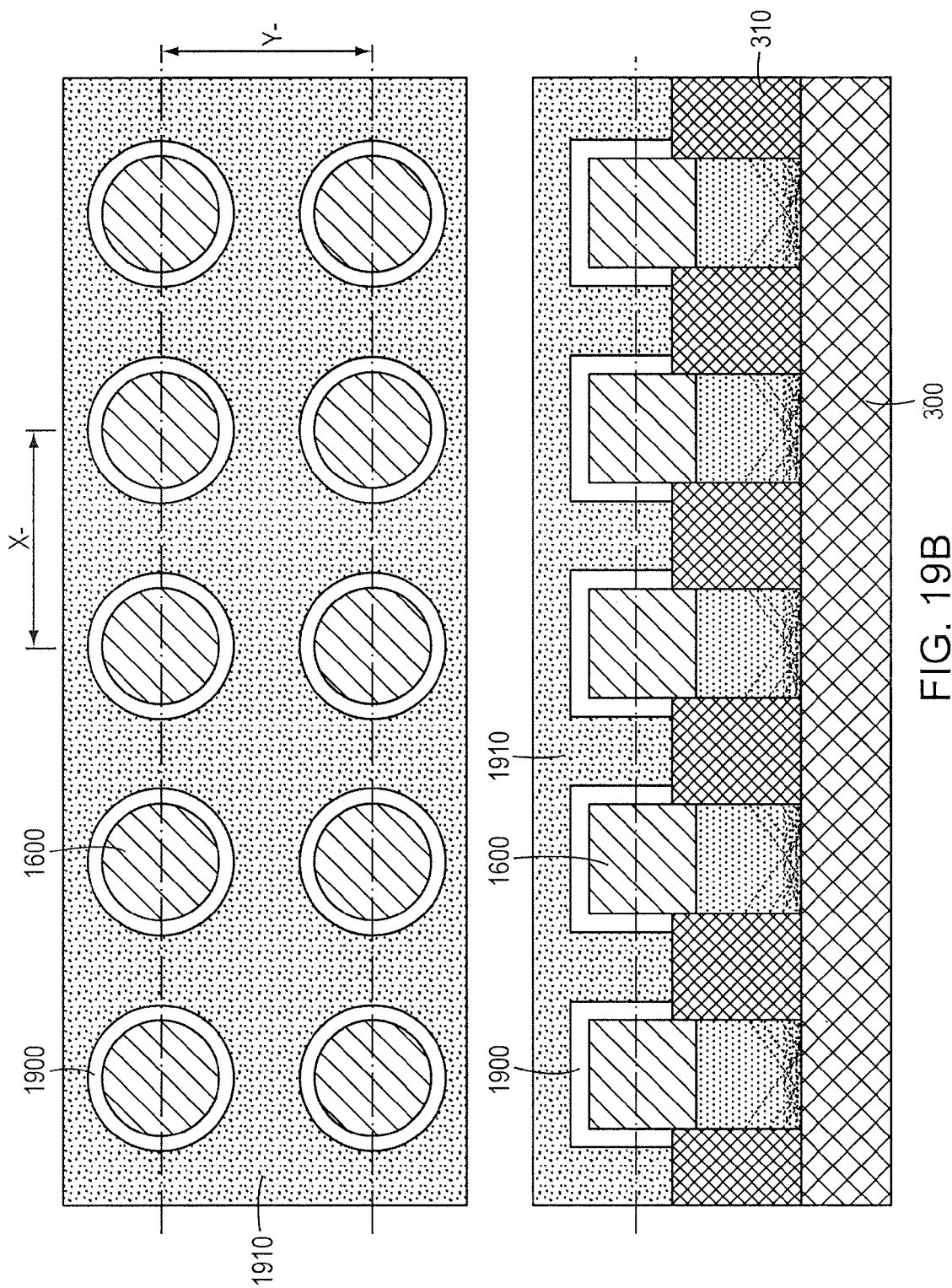

Certain implementations of the present technology focus on arranging light emitting elements to promote directional emission. Often, it is desirable to promote light emission from a semiconducting device in a given direction. Referring to FIG. 19B, an array semiconducting devices, e.g., emitters such as light-emitting diodes (LEDs), is connected in parallel, with the size of the emitting elements varying approximately with the order of the wavelength of the light being emitted. The array may be rectangular in shape. Further, to inhibit light propagation in a given direction, the spacing of light-emitting elements in that direction is preferably equal to an integer number of half-wavelengths of the emitted light. For example, the X-direction and Y-direction spacings may be equal to a half-wavelength of the emitted light. Inhibited X- and Y-propagation may lead to increased emission in the Z direction. This configuration may be of significant advantage for LEDs, for example, where increasing emission in the Z direction (perpendicular to the wafer or chip surface) is often highly desired. In an embodiment, an array of photo-emissive device elements is associated with the rectangular array of openings, and the spacings in each of the x- and the y-directions are equal to an integer number of half wavelengths of a frequency of light emitted by the photo-emissive device elements. In some versions, a hexagonal array of holes, where the spacing between the holes in the X-Y plane is equal to an integer number of half wavelengths, is used to block X and Y direction transmission more effectively than a rectangular array, hence better promoting Z-direction emission.

G. Epitaxial Necking for Hexagonal Semiconductors

Hexagonal semiconductors, such as the III-nitride (III-N) materials, are of great interest for high-power high-speed electronics and light-emitting applications. However, the threading dislocations in such materials typically have a different orientation (e.g. at 0° or 90° to the substrate) relative to the substrate, compared to the more commonly used cubic semiconductors, such as Si, Ge, and GaAs.

For epitaxy of hexagonal semiconductors such as III-nitrides on Si, the (111) surface of Si is commonly preferred over the (100). This is because the (111) surface of Si is hexagonal (even though Si is a cubic crystal). This makes a better template for hexagonal crystal growth than the cubic (100) face. However, epitaxial necking approach discussed above may be less effective in these applications, because the threading dislocations in the hexagonal semiconductors disposed over the lattice-mismatched Si (111) substrates may not be effectively confined by the vertical sidewalls.

Figure 20A:
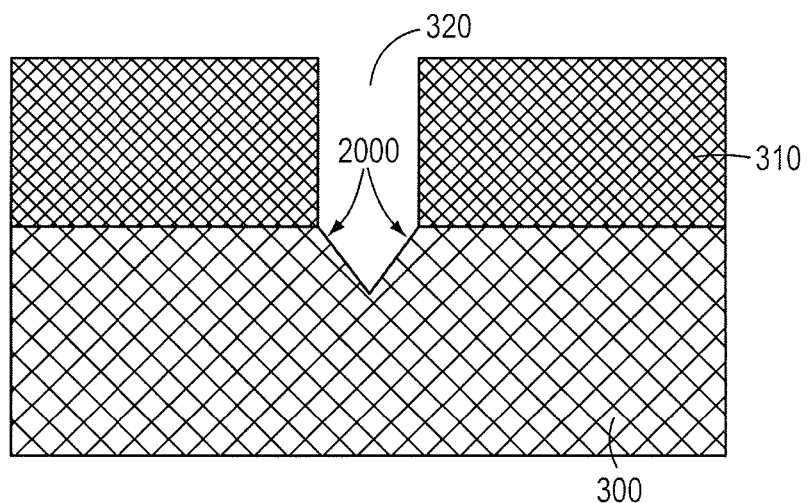
FIGS. 20A-20B, 21A-21B, 22A-22B, 23A-23B, and 24A-24B are schematic cross-sectional and top views of structures incorporating hexagonal non-Si semiconductors, according to various embodiments of the invention.
Figure 20B:
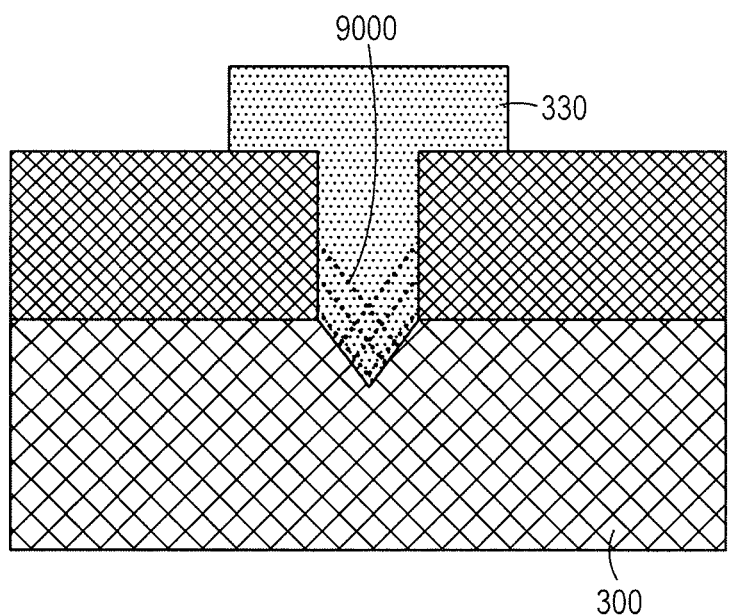

In order to address these concerns, in some implementations, the present technology features a modification to the epitaxial necking technique wherein the surface of the substrate exposed in the seed window is configured to enable confinement of the threading dislocations within the window. Referring to FIG. 20A, after the dielectric mask is disposed over the Si (100) substrate and a seed window is defined therethrough, an etch that is selective to the (111) Si crystal face, for example, a KOH solution, is applied to the portion of the substrate exposed at the bottom of the seed window to expose (111) surfaces 2000. A lattice-mismatched semiconductor material is then deposited in the seed window over the substrate, and the epitaxial deposition continues such that a heteroepitaxial region is grown over the material disposed in the opening, laterally expanding over the mask. Because of the configuration of the underlying surface, orientation of the threading dislocations in the heteroepitaxial region is at approximately 45° to the wafer surface, facilitating trapping of the dislocation by substantially vertical sidewalls of the mask, as shown in FIG. 20B.

Then, if small areas of hexagonal semiconductor material are desired for device active areas, the heteroepitaxial islands resulting from the individual seed windows can be planarized (e.g. via CMP), to be substantially co-planar with the adjacent insulator areas. Alternatively, if a large area is desired, growth can proceed until adjacent islands coalesce, followed optionally by planarization of the resulting structure. In the latter case, because lateral growth rates of hexagonal semiconductor can be dramatically increased over growth rate normal to the surface employing various known approaches, these semiconductors afford process flexibility not available with cubic semiconductors grown on (100) surfaces. Specifically, differential growth rates of these materials allows for widely-spaced seed windows; for example, spacing may be five times the opening width or even greater, offering a substantial advantage over closely-spaced seed windows, if the defects which are known to form when epitaxial growth fronts coalesce cannot be substantially eliminated.

Blocking of the dislocations is also promoted by the forces that cause dislocations to exit a growing crystal at lateral surfaces. Specifically, even when dislocations have an orientation that does not favor trapping at sidewalls, epitaxial necking approach is still effective at certain dimensions because of boundary forces that cause dislocations to propagate to free surfaces in order to reduce the elastic energy of the crystal. As discussed by Tom Langdo in the 2001 thesis referenced above, for the case of Ge grown selectively in holes in an SiO$_2$ mask on Si substrates, it was observed that "all defects within ~300 nm of the window edge are bent and forced out to the SiO$_2$ sidewall." Therefore, epitaxial necking can be effective for hexagonal semiconductors grown on (111) surfaces if the hole or opening width is, for example, on the order of 600 nm, so that all defects will be within 300 nm of a sidewall.

Figure 21A:
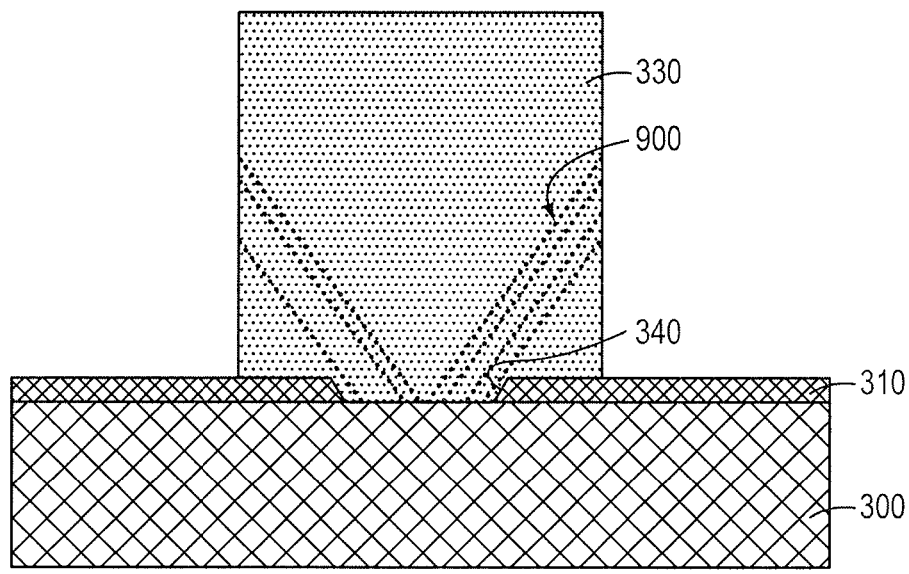
Figure 21B:
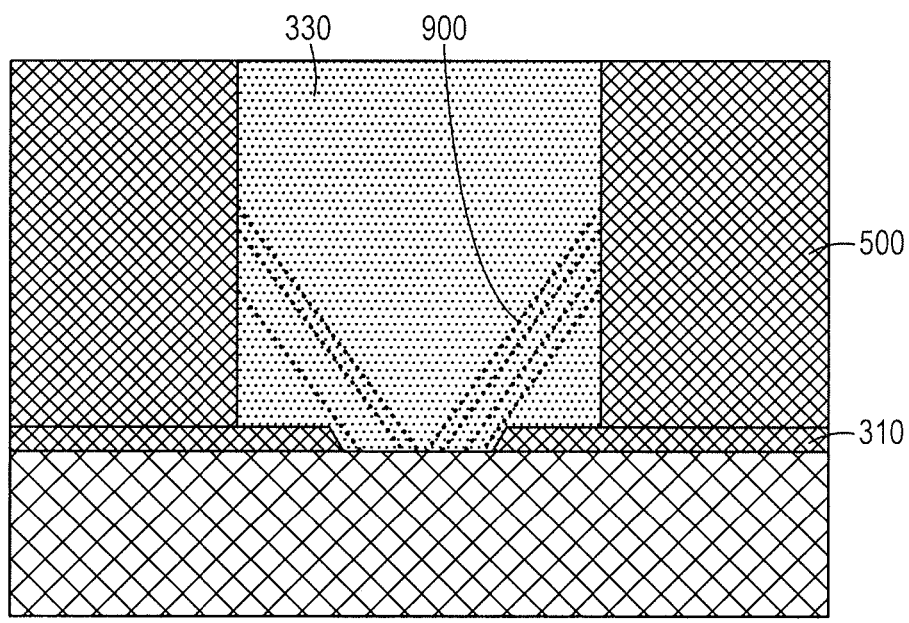

In alternative implementations, epitaxial necking techniques can be used with hexagonal semiconductor materials such as GaN without confining sidewalls of the dielectric mask. Referring to FIG. 21A, after a seed window is patterned in a thin mask over the substrate (see, e.g. FIG. 3), the hexagonal lattice-mismatched semiconductor material is grown in and then above the seed window under process conditions that promote growth normal to the substrate over lateral growth, such that dislocation defects are trapped at boundaries of the heteroepitaxial region despite a lack of physical confinement by the sidewalls of the mask, as in the embodiments described above in connection with FIGS. 20A-20B. Similarly, in other alternative embodiments, III-V materials such as GaAs or InP can be epitaxially grown on a (111) Si substrate in a controlled manner to promote growth normal to the substrate so that defects in III-V materials are trapped despite a lack of confinement by mask sidewalls. Then, as illustrated in FIG. 21B, if desired for various purposes, such as for an active area co-planar with adjacent isolation regions for subsequent device fabrication, an insulating layer can be deposited adjacent to the heteroepitaxial region and the resulting structure planarized.

In other alternative implementations, epitaxial necking can be used in conjunction with lateral growth techniques for hexagonal semiconductor materials such as III-N materials As illustrated in the example of in FIGS. 22-24, epitaxial necking techniques are first used to grow material such as a III-N material in openings so that defects exit the opening sidewalls. Then, after the material reaches the top of the opening, techniques that are known to those of skill in the art of epitaxy are used to increase lateral growth of the. This permits the use of relatively widely spaced seed regions that trap defects, such as openings, as a way to grow relatively wide areas of high quality crystalline material over the top of the mask that defines the openings. For example, by taking advantage of the ability to control the growth rate for III-N materials so that lateral growth is dramatically higher than normal growth, it is practical to use widely spaced seed regions, such as spacing that is between openings that is at least five or ten times five times greater than the opening width. To the extent that there are defects in areas where material originating from separate seed regions coalesces, there will be a wide spacing between such areas.

Figure 22A:
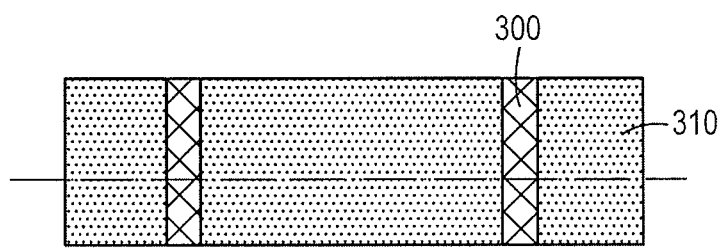
Figure 22B:
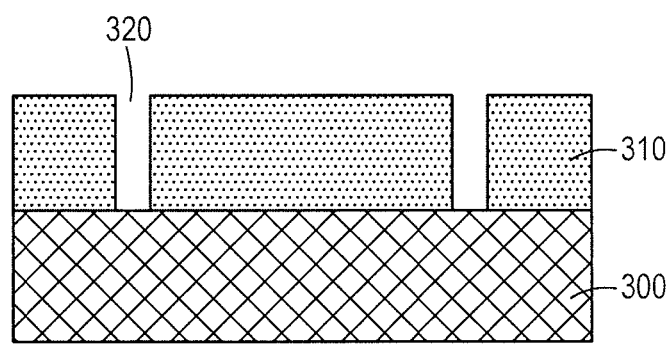
Figure 23A:
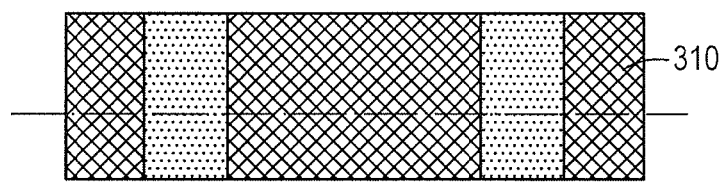
Figure 23B:
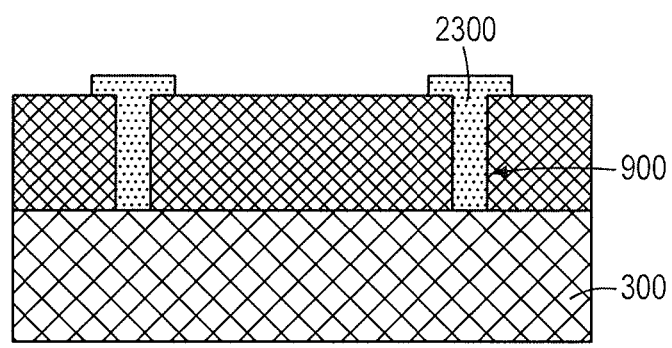
Figure 24A:
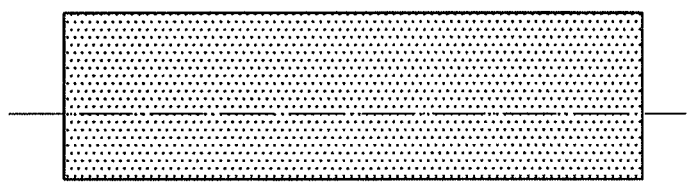
Figure 24B:
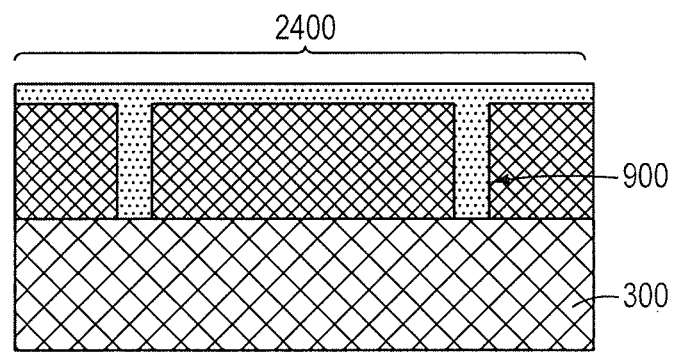

Referring to FIGS. 22A-B, a mask material composed of SiN or SiO$_2$ is deposited over a Si substrate, and openings exposing the Si substrate are defined in the mask using standard lithography and etch techniques. The ratio of the height to the width of the openings is configured so that when epitaxially growing a material in the opening that has a lattice mismatch to Si, such as a III-N, the height is sufficient to permit dislocation defects to exit at the opening sidewalls. As illustrated in FIGS. 23A-B, the lattice-mismatched material is grown to a height above the top 2300 of the openings. Then, by modifying growth conditions to promote the lateral growth rate, such as by modifying the ratios of precursor gas flows, the lattice-mismatched material is grown until adjacent growth fronts coalesce to create a layer that covers the surface area between adjacent openings 2400 as shown in FIGS. 24A-B. By increasing the distance between openings, variations of this embodiment reduce the percentage of the top layer that is subject to possible defects that can arise in regions where adjacent growth fronts coalesce. The coalesced surface can optionally be planarized and also optionally a new layer of material re-grown over the planarized surface if necessary to create a layer and surface with the desired characteristics.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A semiconductor structure comprising:
    a substrate comprising a first crystalline semiconductor material;
    a mask over the substrate, the mask comprising an opening, the opening having a first width at a first point proximate a surface of the substrate, and having a second width at a second point distally located from the surface, wherein the first width is less than the second width; and
    a second crystalline semiconductor material disposed in the opening and extending at least from the first point to the second point, the second crystalline semiconductor material being lattice-mismatched to the first crystalline semiconductor material, wherein a first portion of the second crystalline semiconductor material proximate the substrate is partially relaxed, and a second portion of the second crystalline semiconductor material is substantially relaxed by elastic relaxation.

2. The semiconductor structure of claim 1, wherein the second portion of the second crystalline semiconductor material is above the second point.

3. The semiconductor structure of claim 1, wherein a height of the second crystalline semiconductor material is greater than the first width.

4. The semiconductor structure of claim 1, wherein the second portion of the second crystalline semiconductor material is substantially void of dislocation defects.

5. The semiconductor structure of claim 1, wherein the first point and the second point are on a slanted sidewall of the mask, a portion of the opening having a vertical sidewall, the opening having a third width at a third point on the vertical sidewall, the third width being greater than the second width.

6. The semiconductor structure of claim 1 further comprising an insulator layer over the mask, wherein the second crystalline semiconductor material extends over the mask, and a top surface of the second crystalline semiconductor material is substantially co-planar with a top surface of the insulator layer.

7. The semiconductor structure of claim 1 further comprising a source and a drain of a transistor formed in the second portion of the second crystalline semiconductor material.

8. A semiconductor structure comprising:
    a substrate comprising a first crystalline semiconductor material;
    a mask over the substrate, the mask comprising an opening exposing a portion of the substrate, the opening having a width and a length in a plane parallel to a top surface of the substrate, the length being longer than the width; and
    a second crystalline semiconductor material disposed in the opening and extending over the mask, the second crystalline semiconductor material being lattice-mismatched to the first crystalline semiconductor material, wherein the second crystalline semiconductor material is elastically relaxed in a direction parallel to the width, and the second crystalline semiconductor material is plastically relaxed in a direction parallel to the length.

9. The semiconductor structure of claim 8, wherein the second crystalline semiconductor material is not substantially plastically relaxed in the direction parallel to the width.

10. The semiconductor structure of claim 8 further comprising a gate structure over the second crystalline semiconductor material thereby defining a channel region in the second crystalline semiconductor material, current flow in the channel region being in the direction parallel to the length of the opening.

11. The semiconductor structure of claim 10 further comprising a source and a drain in the second crystalline semiconductor material, the source and the drain being disposed on opposite sides of the channel region.

12. The semiconductor structure of claim 10, wherein the channel region has a uniaxial compressive strain in the direction parallel to the length of the opening.

13. A semiconductor structure comprising:
a substrate comprising a first crystalline semiconductor material;
an isolation region in the substrate, the isolation region defining a planar, rectangular-area surface of the first crystalline semiconductor material of the substrate, the isolation region having a top surface that is co-planar with the planar, rectangular-area surface of the first crystalline semiconductor material;
a second crystalline semiconductor material over and interfacing with the rectangular-area surface of the first crystalline semiconductor material and extending over the isolation region, the second crystalline semiconductor material being lattice mismatched to the first crystalline semiconductor material, the second crystalline semiconductor material comprising a first region proximate the rectangular-area surface and a second region over the first region, the first region having a greater concentration of dislocation defects than the second region; and
a device formed at least partially in the second crystalline semiconductor material.

14. The semiconductor structure of claim 13 wherein the device comprises a source and a drain of a transistor formed in the second region.

15. The semiconductor structure of claim 13 wherein the device comprises a gate structure over the second region.

16. The semiconductor structure of claim 13 wherein a width of the rectangular-area surface and a length of the rectangular-area surface are each less than 1 micrometer, and a height of the first region is less than 120 nanometers.

17. The semiconductor structure of claim 16, wherein the width and the length are each 400 nanometers, and the height of the first region is 50 nanometers.

18. The semiconductor structure of claim 16, wherein the first crystalline semiconductor material consists essentially of silicon, and the second crystalline semiconductor material consists essentially of germanium.

19. The semiconductor structure of claim 16, wherein the width of the rectangular area is equal to the length of the rectangular area.

20. A semiconductor structure comprising:
a substrate comprising a first crystalline semiconductor material;
a mask over the substrate, the mask comprising an opening exposing a portion of the substrate, the opening having a width and a length in a plane parallel to a surface of the substrate, the length being longer than the width; and
a second crystalline semiconductor material disposed in the opening and extending over the mask, the second crystalline semiconductor material having an interface with the first crystalline semiconductor material in the surface of the substrate in the opening, the second crystalline semiconductor material being lattice-mismatched to the first crystalline semiconductor material, the second crystalline semiconductor material having a first dislocation density of dislocations that propagate in a direction parallel to the width and having a second dislocation density of dislocations that propagate in a direction parallel to the length, the first dislocation density being at least a plurality of orders of magnitude greater than the second dislocation density.

* * * * *